(12) United States Patent
Yamatani

(10) Patent No.: US 11,367,841 B2
(45) Date of Patent: Jun. 21, 2022

(54) HETEROCYCLIC COMPOUND AND ORGANIC ELECTROLUMINESCENCE DEVICE INCLUDING THE SAME

(71) Applicant: SAMSUNG DISPLAY CO., LTD., Yongin-si (KR)

(72) Inventor: Akinori Yamatani, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/874,968

(22) Filed: May 15, 2020

(65) Prior Publication Data

US 2020/0280004 A1      Sep. 3, 2020

Related U.S. Application Data

(62) Division of application No. 15/719,823, filed on Sep. 29, 2017, now Pat. No. 10,700,296.

(30) Foreign Application Priority Data

Nov. 8, 2016  (KR) .................. 10-2016-0148376

(51) Int. Cl.
*C07F 7/08* (2006.01)
*H01L 51/00* (2006.01)
(Continued)

(52) U.S. Cl.
CPC ........ *H01L 51/0094* (2013.01); *C07F 7/0814* (2013.01); *H01L 51/0065* (2013.01);
(Continued)

(58) Field of Classification Search
None
See application file for complete search history.

(56) References Cited

U.S. PATENT DOCUMENTS 6,696,182 B2   2/2004 Yamada et al.
6,780,950 B2   8/2004 Cho et al.
(Continued)

FOREIGN PATENT DOCUMENTS

JP    2002-158093 A      5/2002
JP    2003267975 A  *  9/2003   ........... C07D 333/34
(Continued)

OTHER PUBLICATIONS

Sayama, Shinsei (Oxidative Conversion of 3-Alkoxyfurans to 2-Hydroxy-3 (2 H)-furanones and 2-Hydroxy-2-butene-1, 4-diones with 2, 3-Dichloro-5, 6-dicyano-1,4-benzoquinone (DDQ) or Phenyltrimethylammonium Tribromide (PTAB) in t-BuOH) Synthetic Communications 37, No. 18 (2007): 3067-3075. (Year: 2007).*
(Continued)

*Primary Examiner* — Robert S Loewe
(74) *Attorney, Agent, or Firm* — Lewis Roca Rothgerber Christie LLP

(57) ABSTRACT

A heterocyclic compound and an organic electroluminescence device including the same, the heterocyclic compound being represented by Formula 1 below:

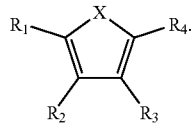

[Formula 1]

12 Claims, 1 Drawing Sheet

(51) Int. Cl.
    *H01L 51/50*         (2006.01)
    *H01L 51/52*         (2006.01)

(52) U.S. Cl.
    CPC ...... *H01L 51/0067* (2013.01); *H01L 51/5012* (2013.01); *H01L 51/5056* (2013.01); *H01L 51/5072* (2013.01); *H01L 51/5206* (2013.01); *H01L 51/5221* (2013.01)

(56) References Cited

U.S. PATENT DOCUMENTS

| | | | |
|---|---|---|---|
| 7,790,890 B2 * | 9/2010 | Oshiyama | H01L 51/0087 546/10 |
| 7,906,228 B2 | 3/2011 | Lee et al. | |
| 7,968,651 B2 | 6/2011 | Huh et al. | |
| 7,981,323 B2 | 7/2011 | Zahn | |
| 8,067,138 B2 | 11/2011 | Wu | |
| 8,257,839 B2 | 9/2012 | Park et al. | |
| 8,603,646 B2 | 12/2013 | Jung et al. | |
| 9,831,438 B2 | 11/2017 | Kim et al. | |
| 2005/0205860 A1 | 9/2005 | Hsu et al. | |
| 2007/0072002 A1 | 3/2007 | Kim et al. | |
| 2007/0270595 A1 | 11/2007 | Kim et al. | |
| 2009/0189519 A1 | 7/2009 | Lee et al. | |
| 2016/0028030 A1 | 1/2016 | Jung et al. | |
| 2018/0123057 A1 | 5/2018 | Yamatani | |
| 2018/0240984 A1 * | 8/2018 | Choi | C07D 409/10 |

FOREIGN PATENT DOCUMENTS

| | | |
|---|---|---|
| JP | 2004-4327106 A | 11/2004 |
| JP | 2012-049352 A | 3/2012 |
| JP | 5596993 B2 | 10/2014 |
| KR | 10-2007-0079878 A | 8/2007 |
| KR | 10-2009-0110014 A | 10/2009 |
| KR | 10-2010-0027439 A | 3/2010 |
| KR | 10-2011-01015228 A | 9/2011 |
| KR | 10-2011-0115891 A | 10/2011 |
| WO | WO 2010/027129 A1 | 3/2010 |

OTHER PUBLICATIONS

Tofi et al. "Regioselective ortho lithiation of 3-aryl and 3-styryl furans." Organic letters 7, No. 15 (2005): 3347-3350. (Year: 2005).*
Yanagisawa et al. "Programmed synthesis of tetraarylthiophenes through sequential C-H arylation." Journal of the American Chemical Society 131, No. 41 (2009): 14622-14623. (Year: 2009).*
Machine translation of JP-2003267975, 33 pages, translation generated Dec. 2020. (Year: 2020).*
Roth et al. "Synthese phenylsubstituierter Pyrrole." Archiv der Pharmazie 303, No. 9 (1970): 753-759. (Year: 1970).*
Mehta et al. "Highly chemoselective and stereoselective conjugate addition of benzyl copper reagents to α-oxoketene dithioacetals." Tetrahedron letters 36, No. 11 (1995): 1925-1928. (Year: 1995).*
Allegretti et al. "Generation of α, β-unsaturated platinum carbenes from homopropargylic alcohols: rearrangements to polysubstituted furans." Organic letters 13, No. 21 (2011): 5924-5927. (Year: 2011).*
Liu et a;. "One-pot highly efficient synthesis of substituted pyrroles and N-bridgehead pyrroles by zinc-catalyzed multicomponent reaction." Organic & biomolecular chemistry 8, No. 13 (2010): 3064-3072. (Year: 2010).*
Gilman et al. "Some Anil Additions Involving Organosilicon Compounds", Journal of the American Chemical Society 71, No. 3 (1949): 1117-1117. (Year: 1949).*
Dekura et al. "Synthesis of tetra-and penta-substituted pyrrole derivatives from azazirconacyclopentene and acyl halide in the presence of CuCl", Chemistry letters 26, No. 8 (1997): 825-826. (Year: 1997).*
Matsui et al. "Ruthenium-catalyzed transfer oxygenative [2+ 2+ 1] cycloaddition of silyldiynes using nitrones as adjustable oxygen atom donors. Synthesis of bicyclic 2-silylfurans", ACS Catalysis 5, No. 11 (2015): 6468-6472. (Year: 2015).*
Teresa Varea, et al., "A Simple and Efficient Route to 1,4-Diketones from Squaric Acid," Tetrahedron, vol. 51, No. 45, (1995), pp. 12373-12382.
Yancheng Hu, et al., "Synthesis of Tetrasubstituted Pyrroles from Terminal Alkynes and Imines," Organic Letters, vol. 15, No. 12, (2013), pp. 3146-3149.
Yuan Gao, et al., "Synthesis of Substituted Pyrroles from an Alkyne, an Imine and Carbon Monoxide via an Organotitanium Intermediate," Tetrahedron Letters, vol. 37, No. 43, (1996) pp. 7787-7790.
Dieter Hubmann, et al., "Synthesis of N-Phenylpyrrole Carboximides," Molecules, ISSN 1420-3049, No. 4., (1999) pp. 151-158.

* cited by examiner

HETEROCYCLIC COMPOUND AND ORGANIC ELECTROLUMINESCENCE DEVICE INCLUDING THE SAME

CROSS-REFERENCE TO RELATED APPLICATIONS

This application is a divisional of U.S. patent application Ser. No. 15/719,823, filed on Sep. 29, 2017, which claims priority to and benefit of Korean Patent Application No. 10-2016-0148376, filed on Nov. 8, 2016, in the Korean Intellectual Property Office, and entitled: "Heterocyclic Compound And Organic Electroluminescence Device Including The Same," is incorporated by reference herein in its entirety.

BACKGROUND

1. Field

Embodiments relate to a heterocyclic compound and an organic electroluminescence device including the same.

2. Description of the Related Art

The development of an organic electroluminescence display as an image display is being actively conducted. The organic electroluminescence display is different from a liquid crystal display and is a self-luminescent display accomplishing displays via the recombination of holes and electrons injected from a first electrode and a second electrode in an emission layer and via light emission from a luminescent material including an organic compound in the emission layer.

As an organic electroluminescence device, an organic device including, for example, a first electrode, a hole transport layer disposed on the first electrode, an emission layer disposed on the hole transport layer, an electron transport layer disposed on the emission layer, and a second electrode disposed on the electron transport layer is well known. Holes are injected from the first electrode, and the injected holes move via the hole transport layer and are injected into the emission layer. Meanwhile, electrons are injected from the second electrode, and the injected electrons move via the electron transport layer and are injected into the emission layer. The holes and electrons injected into the emission layer recombine to produce excitons in the emission layer. The organic electroluminescence device emits light using light generated by the transition of the excitons to a ground state. In addition, an embodiment of the configuration of the organic electroluminescence device is not limited thereto, but various modifications may be possible.

SUMMARY

Embodiments are directed to a heterocyclic compound and an organic electroluminescence device including the same.

The embodiments may be realized by providing a heterocyclic compound represented by the following Formula 1:

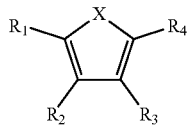

[Formula 1]

wherein in Formula 1, X is $NR_5$, O, or S, $R_1$ to $R_4$ are each independently a hydrogen atom, a substituted or unsubstituted amino group, a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, $R_1$ to $R_4$ being separate or forming a ring via combination of adjacent groups with each other, $R_5$ is a hydrogen atom, a deuterium atom, a substituted or unsubstituted silyl group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, at least one of $R_1$ to $R_4$ is a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted aralkyl group, a substituted or unsubstituted sulfoxy group, or a substituted or unsubstituted phosphine oxide group, and at least two of $R_1$ to $R_4$ are not an aryl group or a heteroaryl group.

Two of $R_1$ to $R_4$ may each independently be an aryl group or a heteroaryl group, and at least one of the remaining ones of $R_1$ to $R_4$ may be a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted aralkyl group, a substituted or unsubstituted sulfoxy group, or a substituted or unsubstituted phosphine oxide group.

Two of $R_1$ to $R_4$ may each independently be a substituted or unsubstituted aryl group having 6 to 15 ring carbon atoms or a substituted or unsubstituted heteroaryl group having 2 to 15 ring carbon atoms, and at least one of the remaining ones of $R_1$ to $R_4$ may be a substituted or unsubstituted silyl group.

Two of $R_1$ to $R_4$ may each independently be a substituted or unsubstituted phenyl group, and at least one of the remaining ones of $R_1$ to $R_4$ may be a triphenylsilyl group.

X may be $NR_5$.

$R_5$ may be a substituted or unsubstituted aryl group having 6 to 15 ring carbon atoms.

$R_5$ may be a substituted or unsubstituted phenyl group.

X may be $NR_5$, at least one of $R_1$ to $R_5$ may be a group represented by $-L_1-Y_1$, $L_1$ may be a substituted or unsubstituted arylene group having 6 to 30 ring carbon atoms, and $Y_1$ may be a substituted or unsubstituted silyl group, a substituted or unsubstituted pyrrolyl group, a substituted or unsubstituted thienyl group, or a substituted or unsubstituted furanyl group.

The compound represented by Formula 1 may be represented by the following Formula 2:

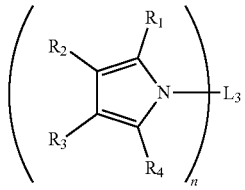

[Formula 2]

wherein in Formula 2, n may be an integer of 1 to 3, when n is 2 or 3, a plurality of $R_1$ to $R_4$ may be the same or different from each other, $L_3$ may be a direct linkage or a substituted or unsubstituted aryl group having 6 to 30 ring carbon atoms, and $R_1$ to $R_4$ may be defined the same as those of Formula 1.

The compound represented by Formula 1 may be represented by the following Formula 3:

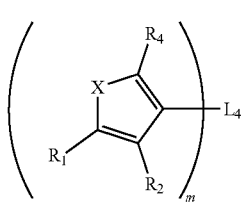

[Formula 3]

wherein in Formula 3, m may be an integer of 1 to 3, when m is 2 or 3, a plurality of $R_1$, $R_2$, and $R_4$ may be the same or different from each other, $L_4$ may be a direct linkage or a substituted or unsubstituted aryl group having 6 to 30 ring carbon atoms, and X, $R_1$, $R_2$, and $R_4$ may be defined the same as those of Formula 1.

The compound represented by Formula 1 may be represented by the following Formula 4:

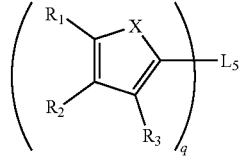

[Formula 4]

wherein in Formula 4, q may be an integer of 1 to 3, when q is 2 or 3, a plurality of $R_1$ to $R_3$ may be the same or different from each other, $L_5$ may be a direct linkage or a substituted or unsubstituted aryl group having 6 to 30 ring carbon atoms, and X, and $R_1$ to $R_3$ may be defined the same as those of Formula 1.

The compound represented by Formula 1 may be represented by the following Formula 5:

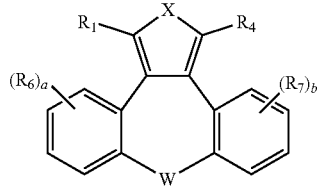

[Formula 5]

wherein Formula 5, W may be O, S, $PR_8$, S=O, $SO_2$, P=$OR_9$, $CR_{10}R_{11}$, or $SiR_{12}R_{13}$, $R_6$ to $R_{13}$ may each independently be a hydrogen atom, a deuterium atom, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, a and b may each independently be an integer of 0 to 4, and X, $R_1$ and $R_4$ may be defined the same as those of Formula 1.

The heterocyclic compound represented by Formula 1 may be a compound of the following Compound Group 1:

[Compound Group 1]

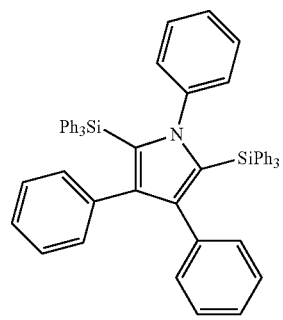

1

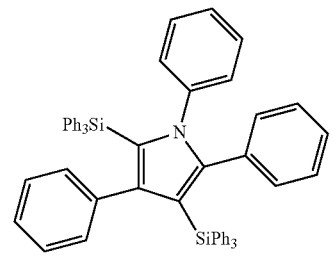

2

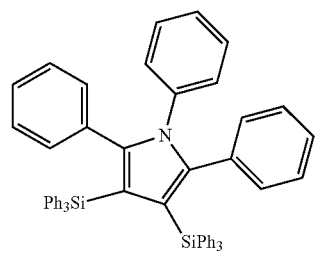

3

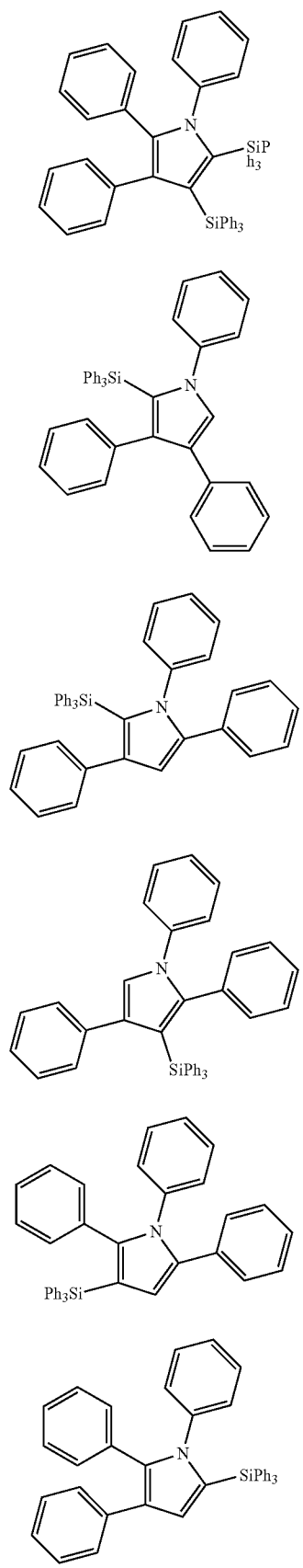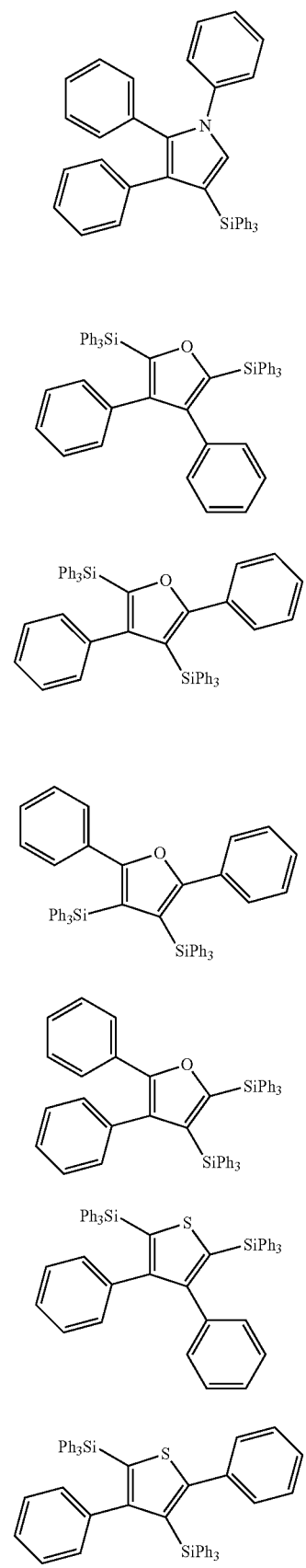

17
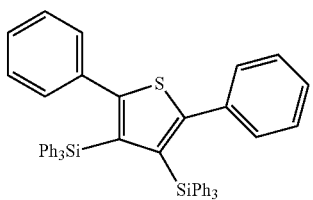
18
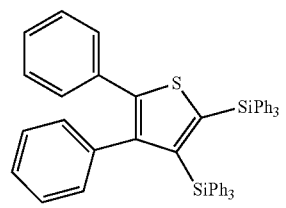
19
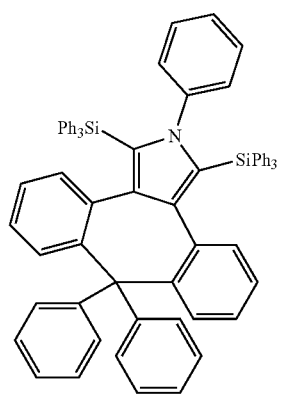
20
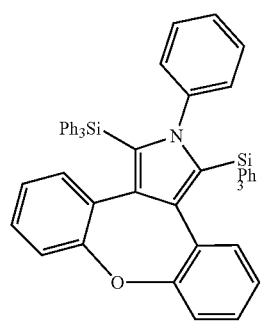
25
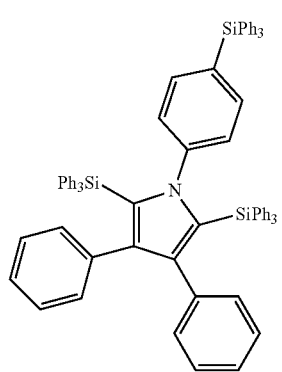
26
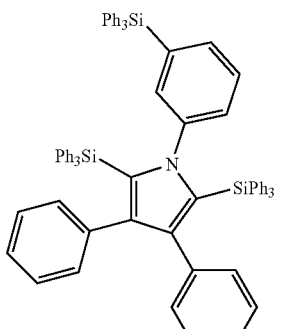
27
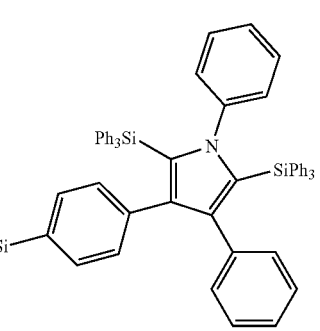
28
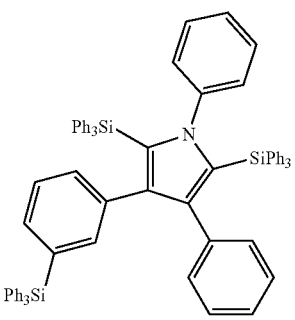
29
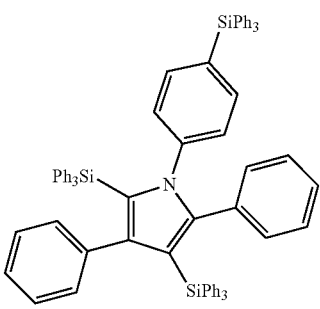
30
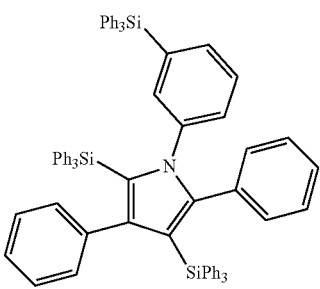

-continued
31
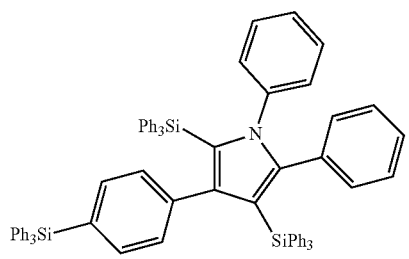
32
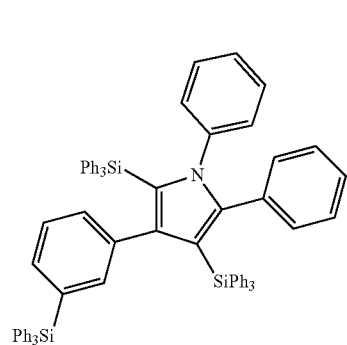
33
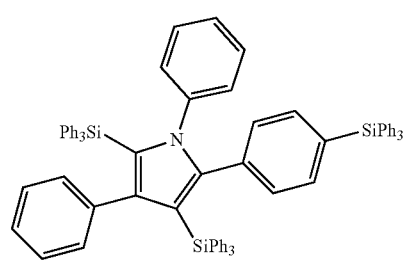
34
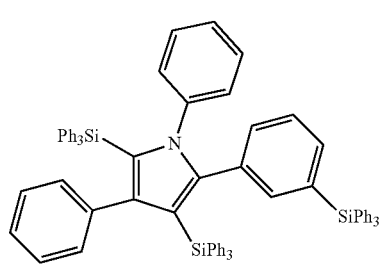
35
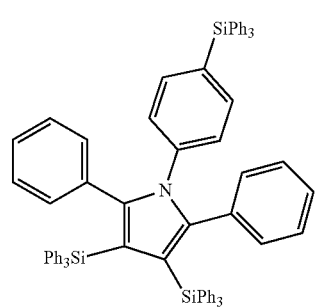
-continued
36
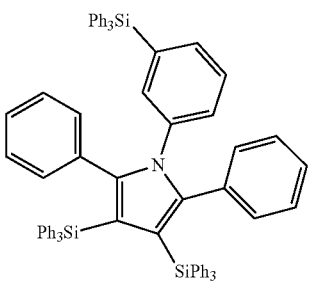
37
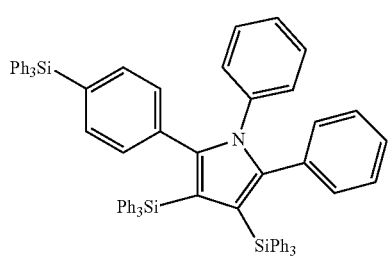
38
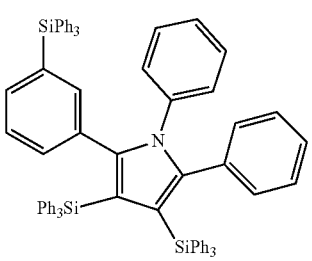
39
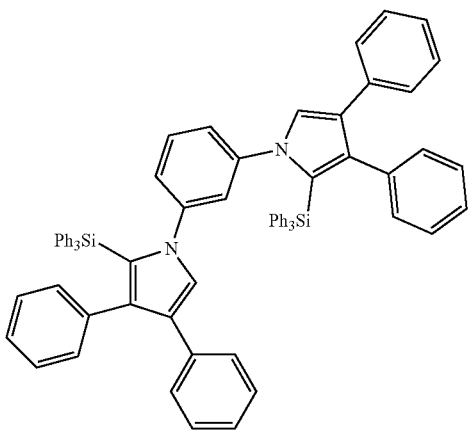

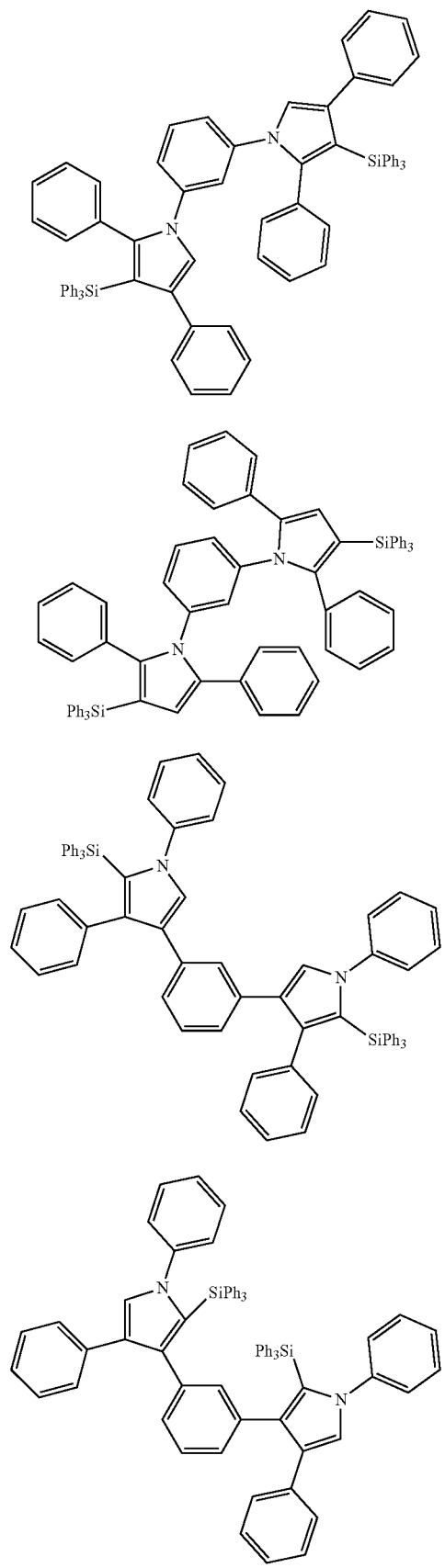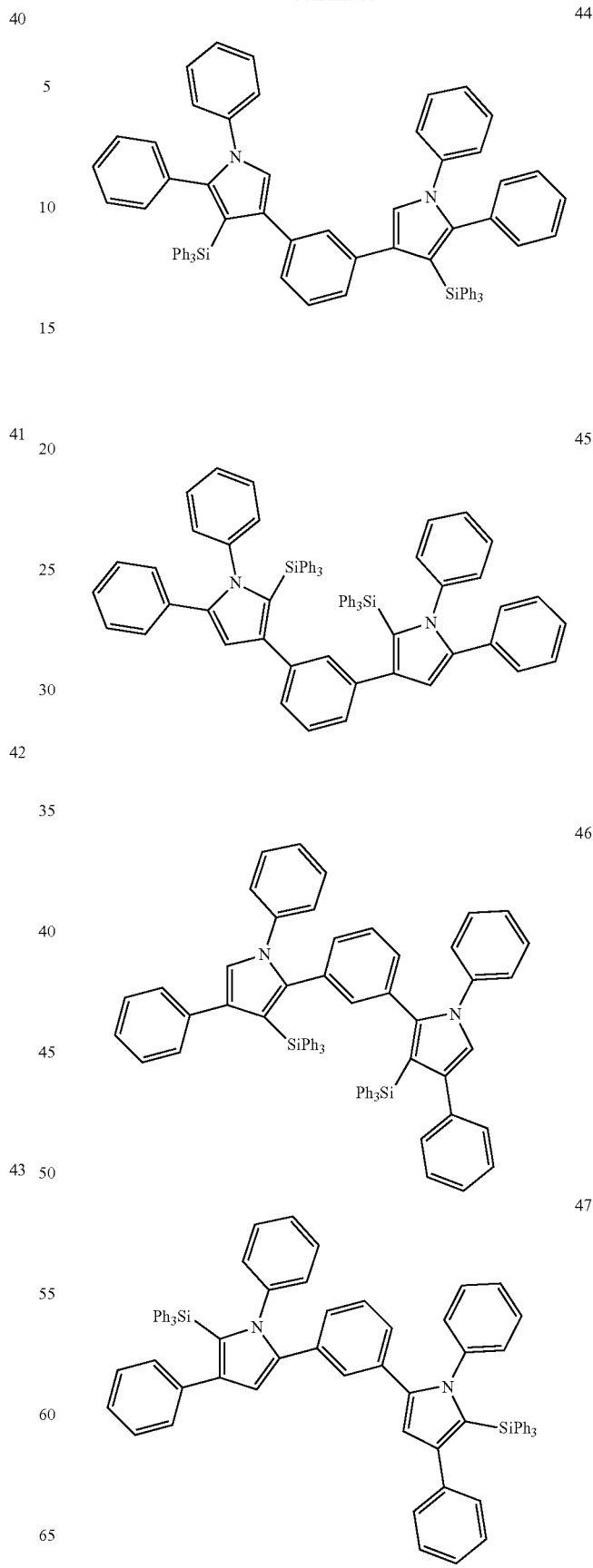

-continued
48
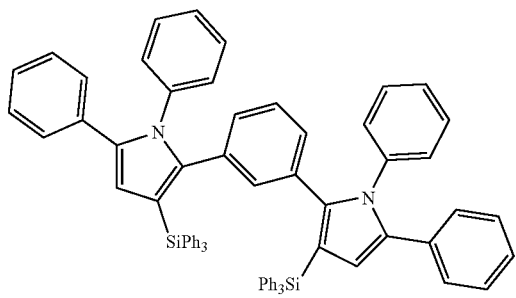
49
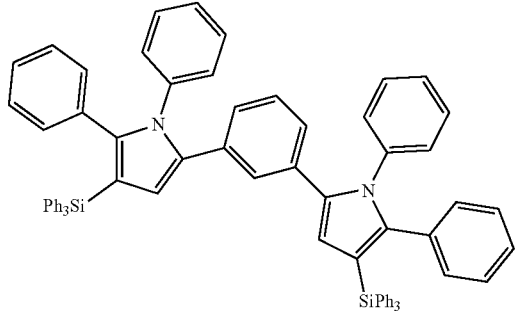
50
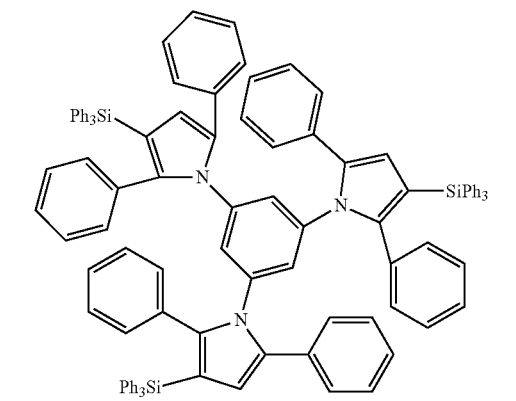
51
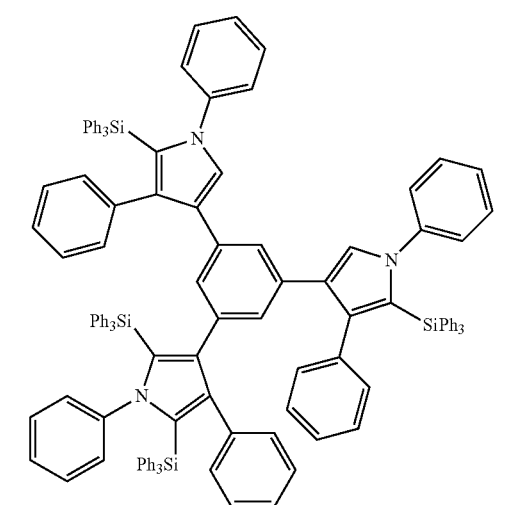
52
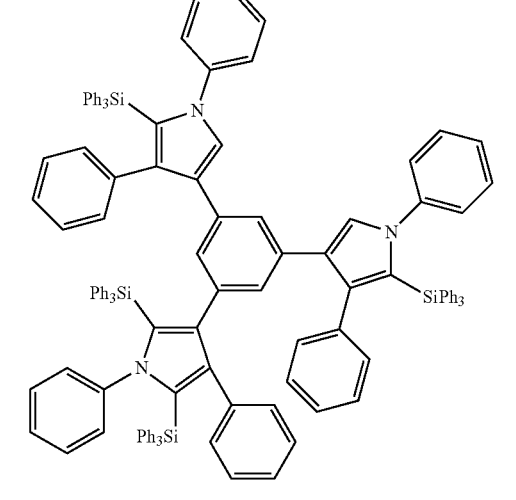
53
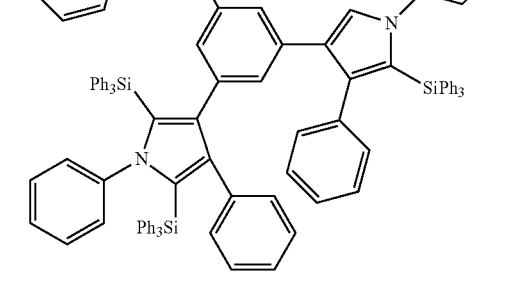
54
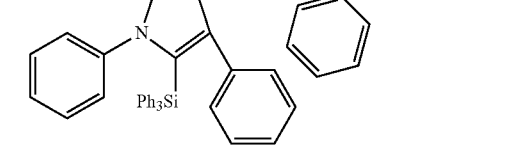
55
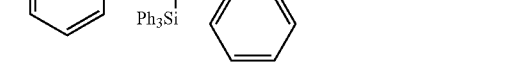

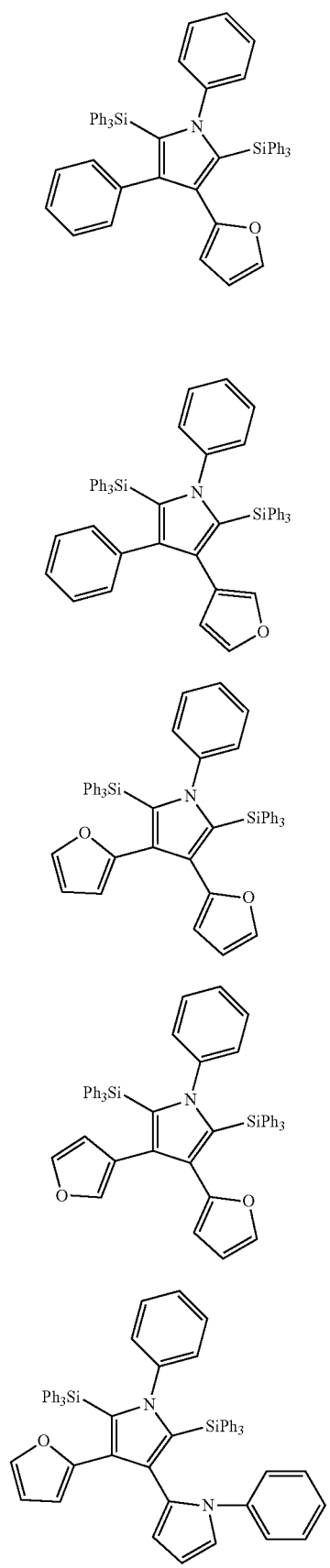
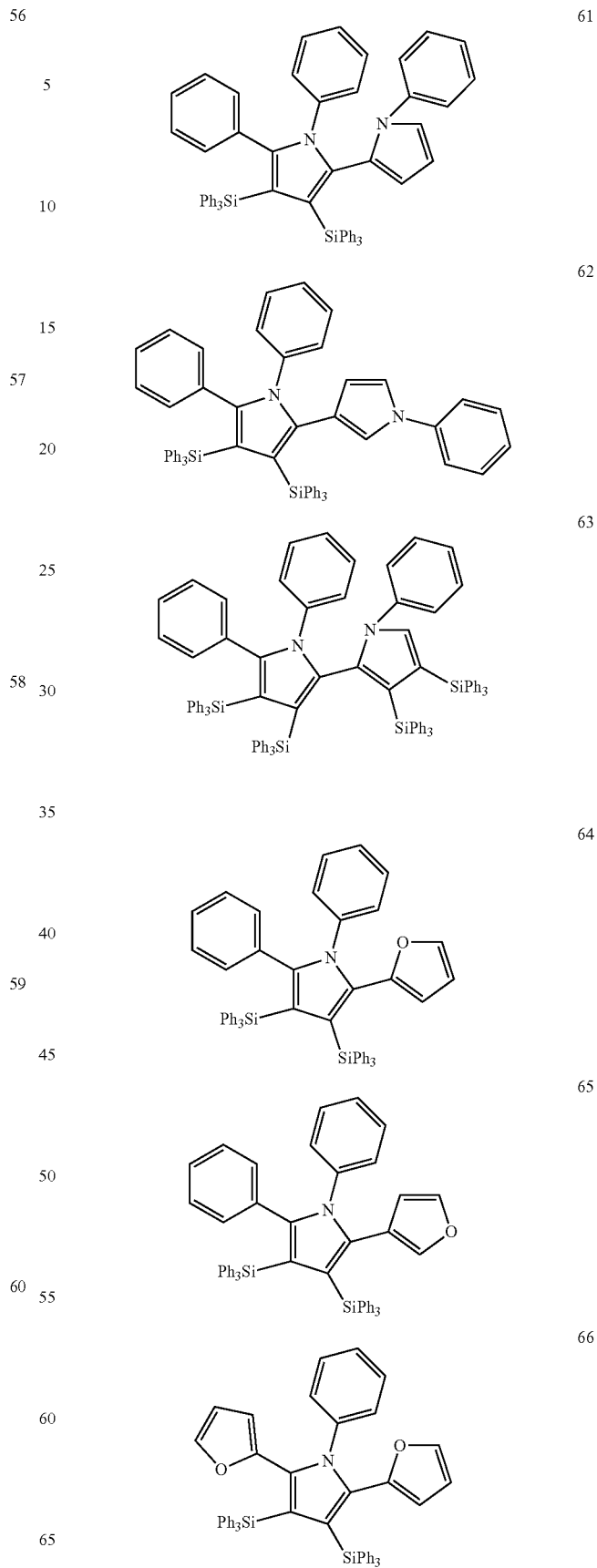

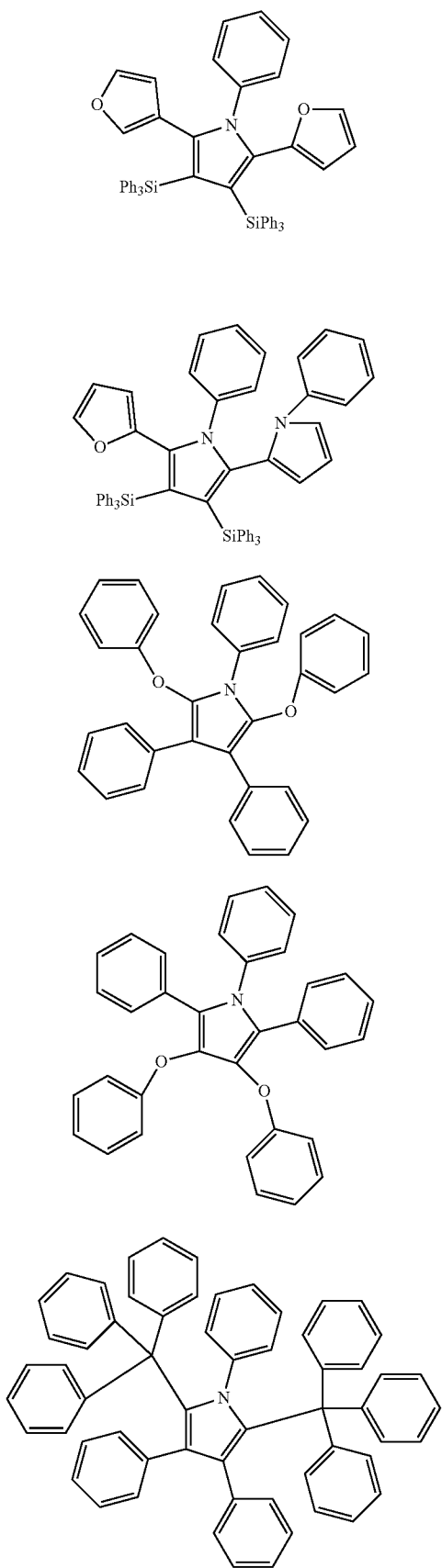

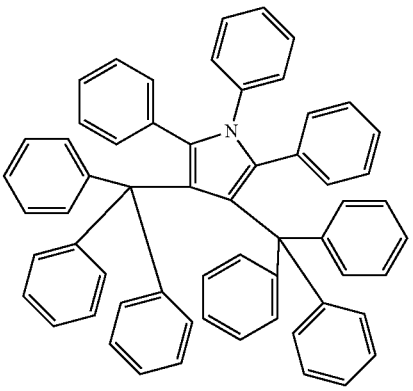

The embodiments may be realized by providing an organic electroluminescence device including a first electrode; a hole transport region on the first electrode; an emission layer on the hole transport region; an electron transport region on the emission layer; and a second electrode on the electron transport region, wherein the hole transport region includes a heterocyclic compound represented by the following Formula 1:

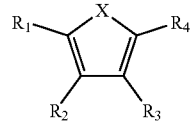

[Formula 1]

wherein in Formula 1, X is NR$_5$, O or S, R$_1$ to R$_4$ are each independently a hydrogen atom, a substituted or unsubstituted amino group, a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, R$_1$ to R$_4$ being separate or forming a ring via combination of adjacent groups with each other, R$_5$ is a hydrogen atom, a deuterium atom, a substituted or unsubstituted silyl group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, at least one of R$_1$ to R$_4$ is a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted aralkyl group, a substituted or unsubstituted sulfoxy group, or a substituted or unsubstituted phosphine oxide group, and at least two of $R_1$ to $R_4$ are not an aryl group or a heteroaryl group.

Two of $R_1$ to $R_4$ may each independently be an aryl group or a heteroaryl group, and at least one of the remaining ones of $R_1$ to $R_4$ may be a substituted or unsubstituted silyl group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted aralkyl group, a substituted or unsubstituted sulfoxy group, or a substituted or unsubstituted phosphine oxide group.

X may be $NR_5$, at least one of $R_1$ to $R_5$ may be a group represented by -$L_1$-$Y_1$, $L_1$ may be a substituted or unsubstituted arylene group having 6 to 30 ring carbon atoms, and $Y_1$ may be a substituted or unsubstituted silyl group, a substituted or unsubstituted pyrrolyl group, a substituted or unsubstituted thienyl group, or a substituted or unsubstituted furanyl group.

X may be $NR_5$, and $R_5$ may be the same as defined in Formula 1.

The compound represented by Formula 1 may be represented by one of the following Formulae 2 to 4:

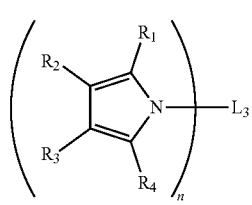

[Formula 2]

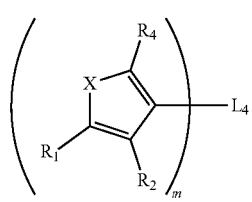

[Formula 3]

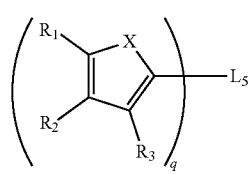

[Formula 4]

wherein in Formulae 2 to 4, n, m, and p may each independently be an integer of 1 to 3, when n is 2 or 3, a plurality of $R_1$ to $R_4$ may be the same or different from each other, when m is 2 or 3, a plurality of $R_1$, $R_2$, and $R_4$ may be the same or different from each other, when q is 2 or 3, a plurality of $R_1$ to $R_3$ may be the same or different from each other, $L_3$ to $L_5$ may each independently be a direct linkage or a substituted or unsubstituted aryl group having 6 to 30 ring carbon atoms, and X, and $R_1$ to $R_4$ may be defined the same as those of Formula 1.

The compound represented by Formula 1 may be represented by the following Formula 5:

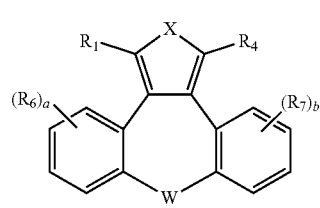

[Formula 5]

wherein in Formula 5, W may be O, S, $PR_8$, S=O, $SO_2$, P=$OR_9$, $CR_{10}R_{11}$, or $SiR^{12}R^{13}$, $R_6$ to $R_{13}$ may each independently be a hydrogen atom, a deuterium atom, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, a and b may each independently be an integer of 0 to 4, and X, $R_1$ and $R_4$ may be defined the same as those of Formula 1.

The heterocyclic compound represented by Formula 1 may be a compound of the following Compound Group 1:

[Compound Group 1]

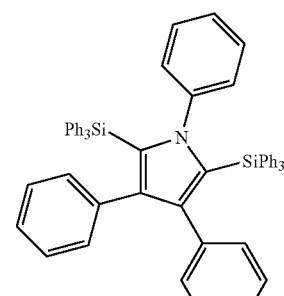

1

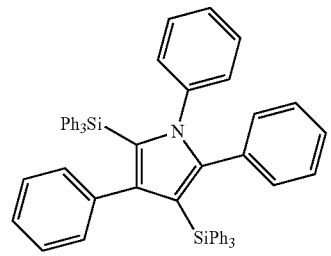

2

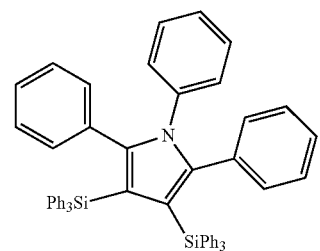

3

4
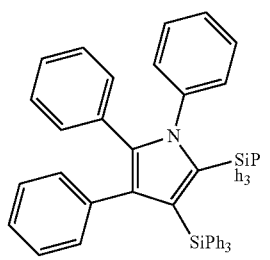
5
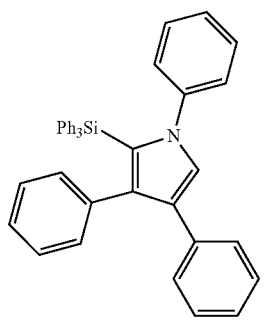
6
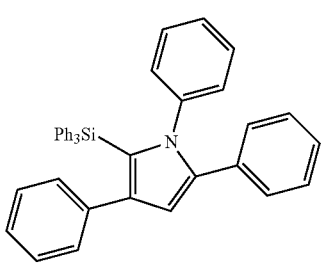
7
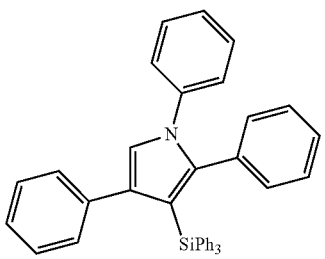
8
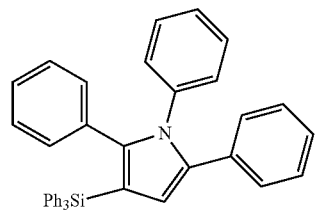
9
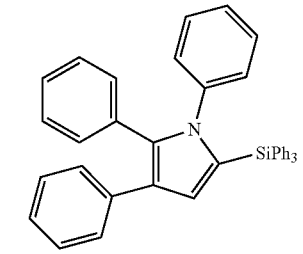
10
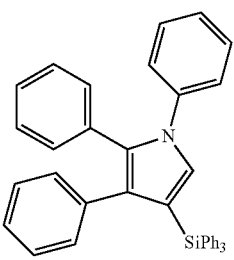
11
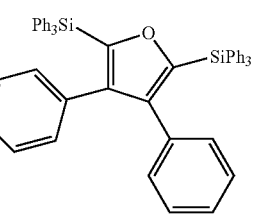
12
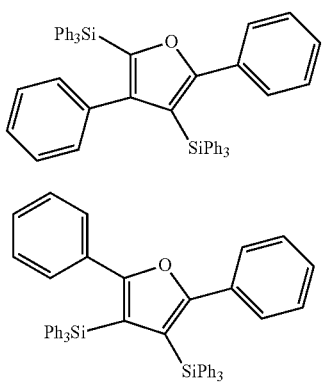
13
14
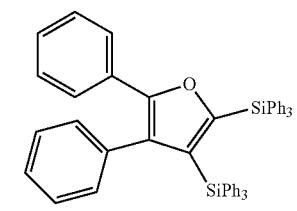
15
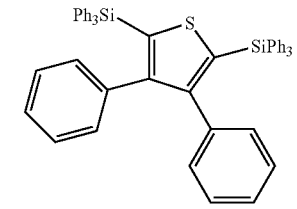
16
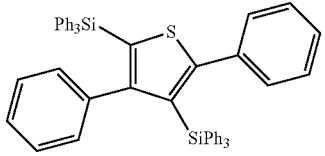

17
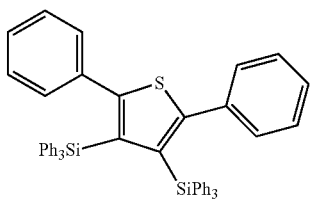
18
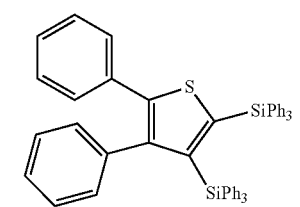
19
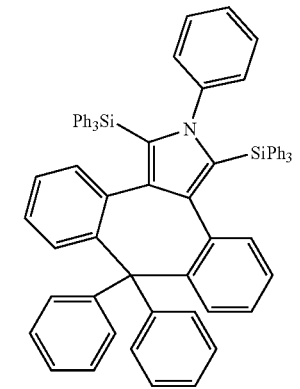
20
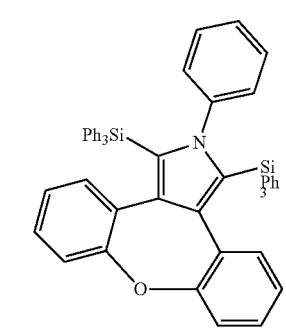
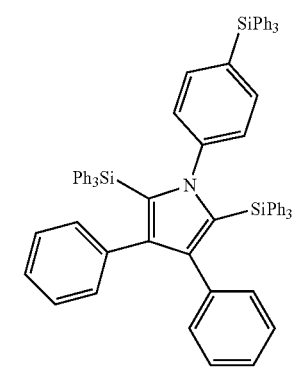
26
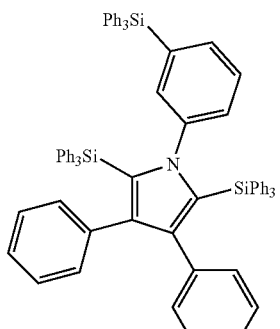
27
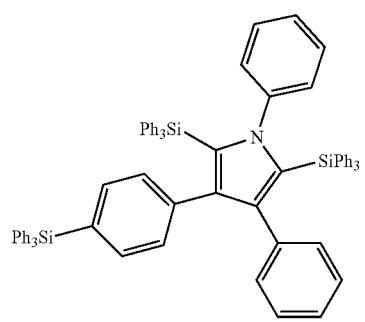
28
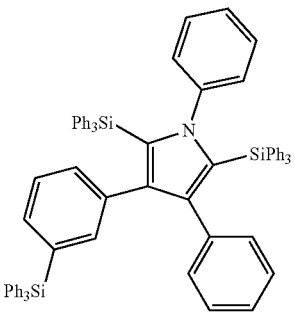
29
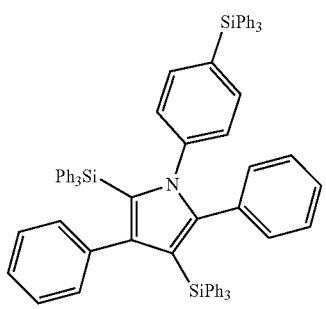
30
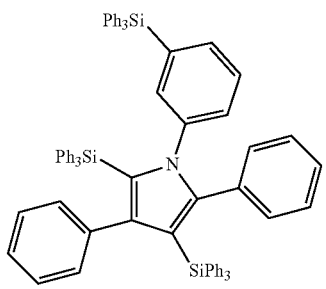

31
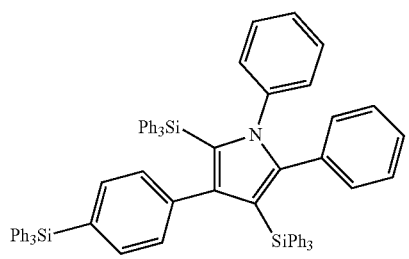
32
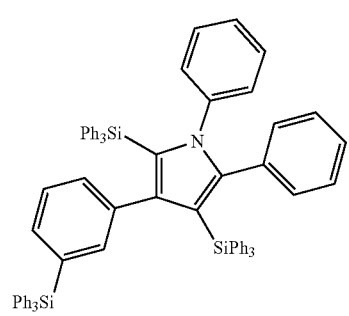
33
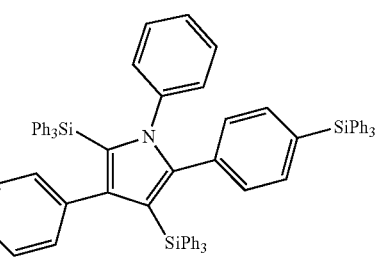
34
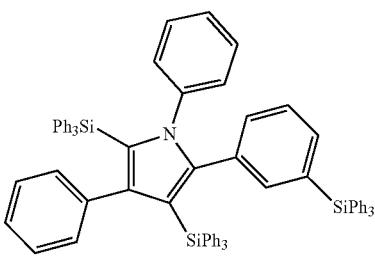
35
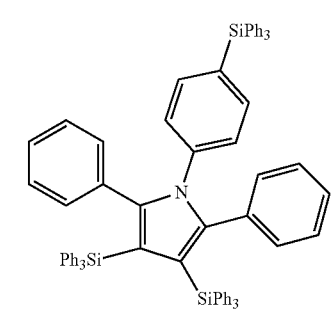
36
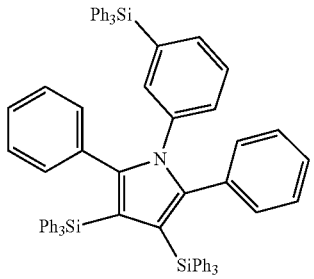
37
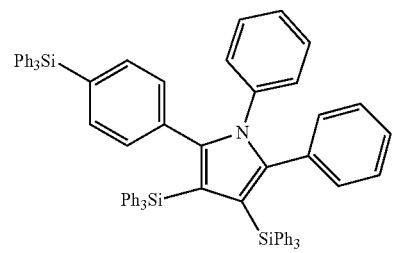
38
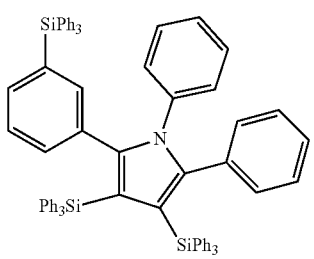
39
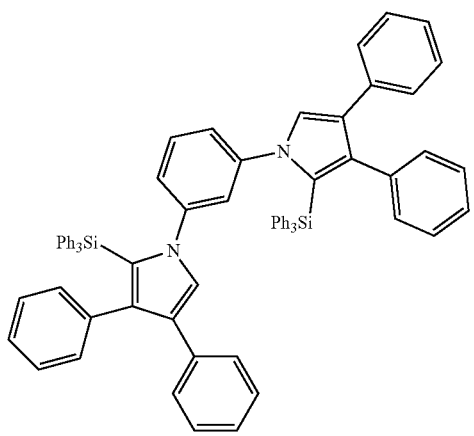

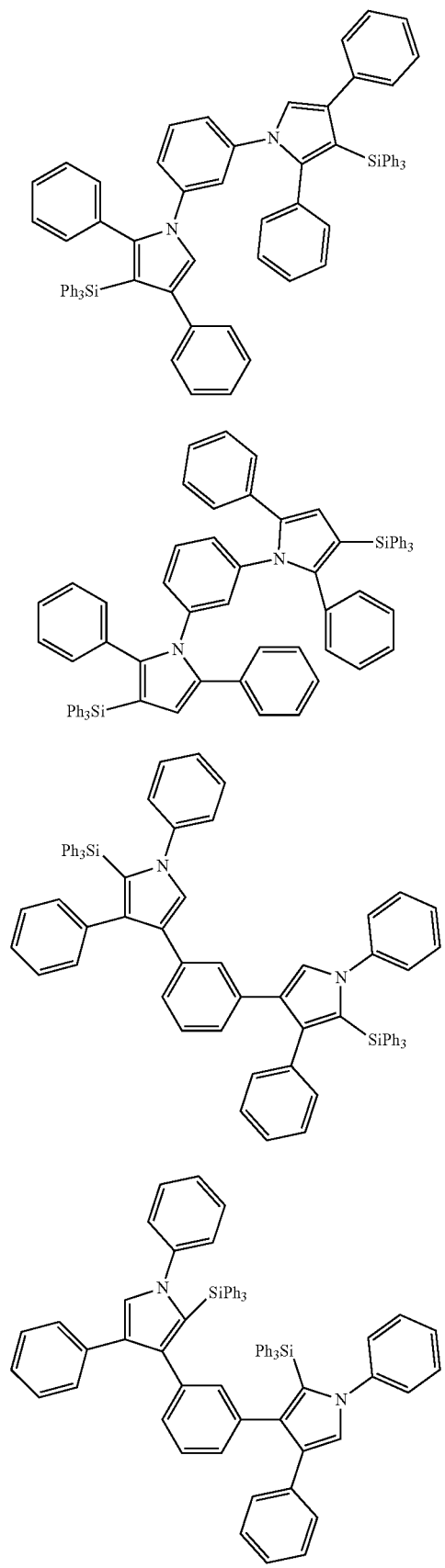
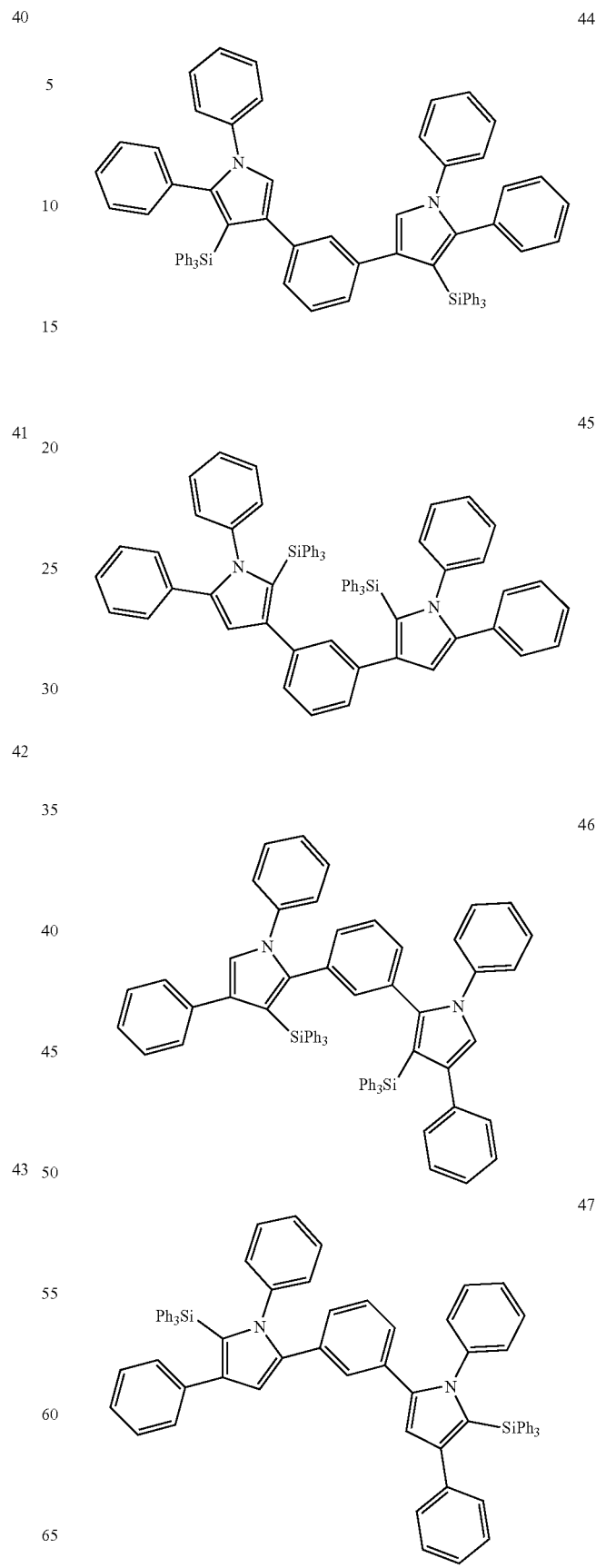

48
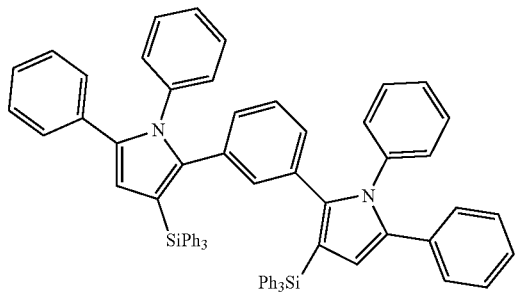
49
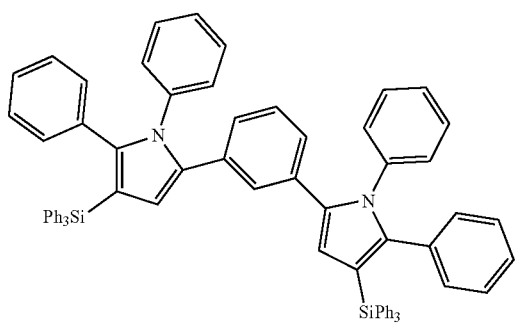
50
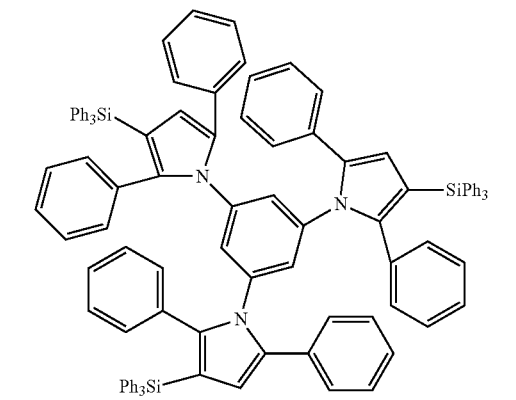
51
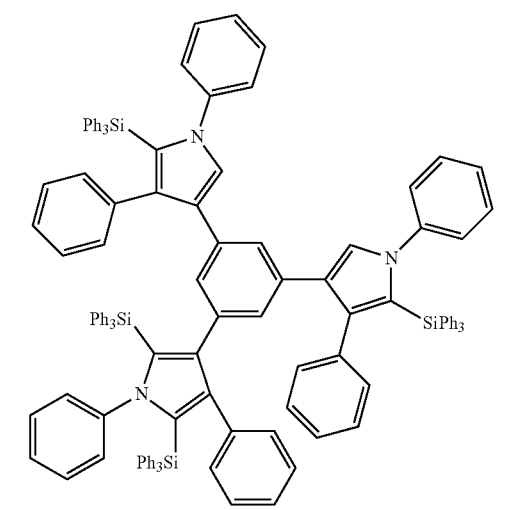
52
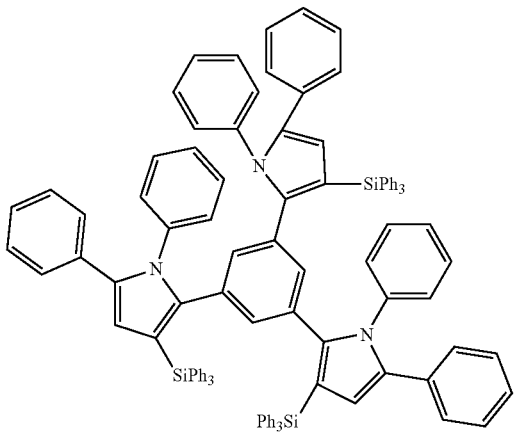
53
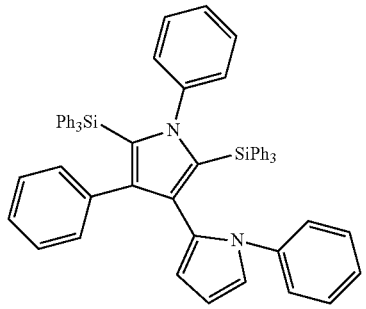
54
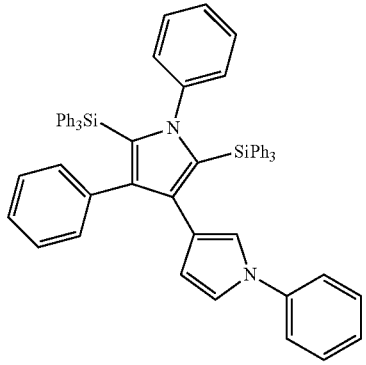
55
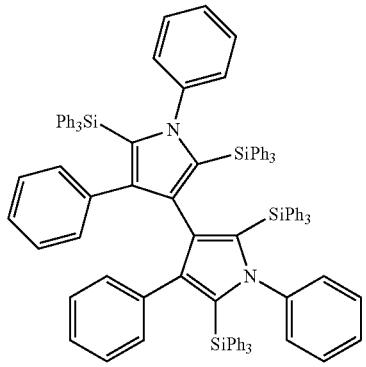

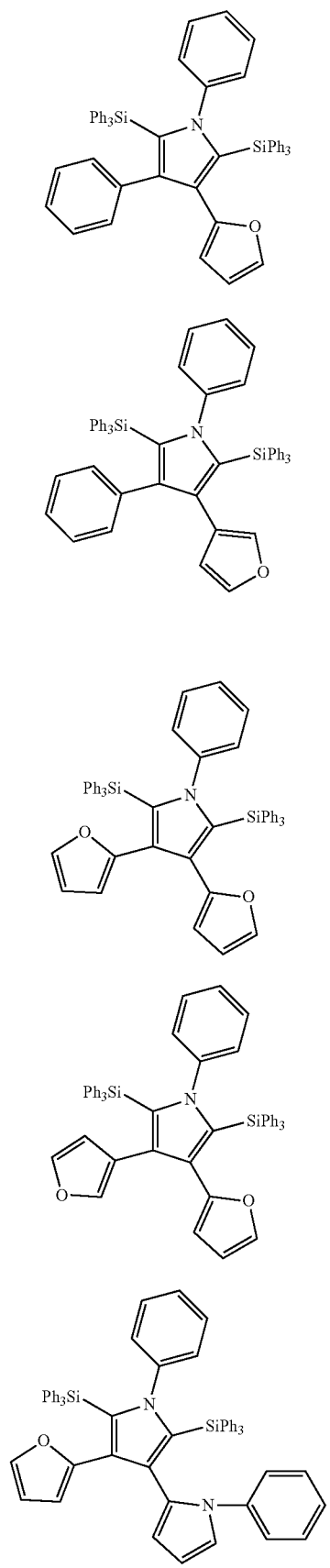
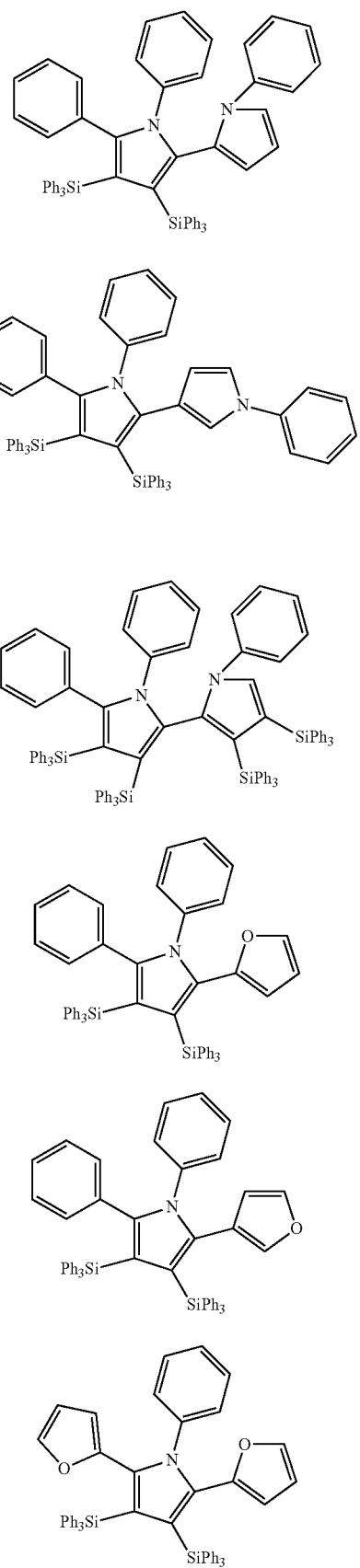

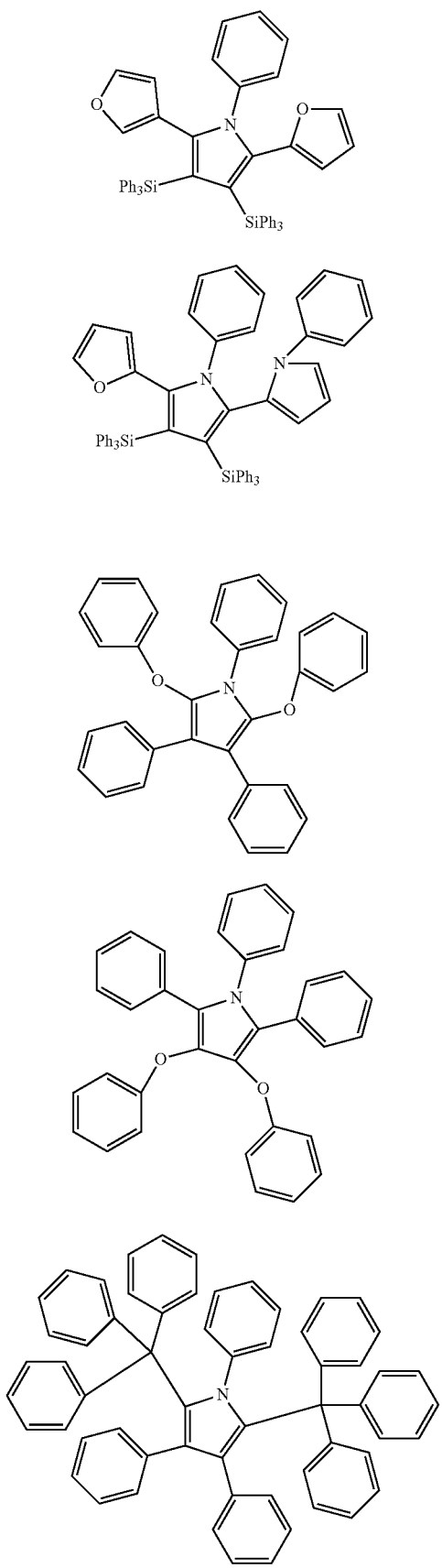

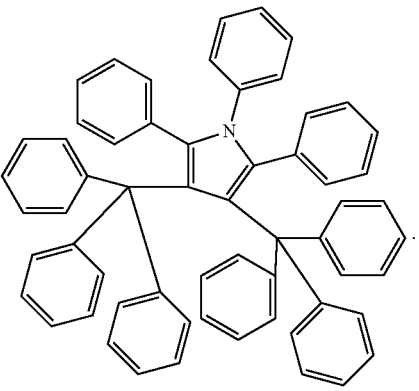

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
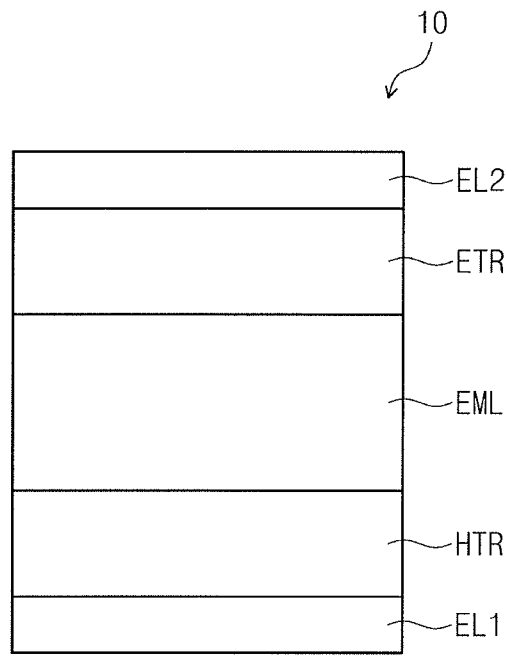
FIG. 1 illustrates a cross-sectional view of an organic electroluminescence device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements for explaining each drawing. In the drawings, the sizes of elements may be enlarged for clarity of the present disclosure. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "including," "comprises," or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being 'on' another part, it can be directly on the other part, or intervening layers may also be present. On the contrary, when a layer, a film, a region, a plate, etc. is referred to as being 'under' another part, it can be directly under the other part, or intervening layers may also be present. As used herein, the term "or" is not an exclusive term, e.g., A or B includes A, B, or A and B.

In the present disclosure, ———* means a part to be connected, e.g., a bonding site.

In the present disclosure, "substituted or unsubstituted" may mean substituted with deuterium, halogen, cyano, nitro, amino, silyl, boron, arylamine, phosphine oxide, phosphine sulfide, alkyl, alkenyl, aryl, and heteroaryl or unsubstituted. In addition, each of the substituent illustrated above may be substituted or unsubstituted. For example, biphenyl may be interpreted as aryl, or phenyl substituted with phenyl.

In the present disclosure, the description of forming a ring by combining with an adjacent group may mean forming substituted or unsubstituted cyclic hydrocarbon, or substituted or unsubstituted heterocycle by combining with an adjacent group. The cyclic hydrocarbon may include aliphatic cyclic hydrocarbon and aromatic cyclic hydrocarbon. The heterocycle may include aliphatic heterocycle and aromatic heterocycle. The cyclic hydrocarbon and heterocycle may be a monocycle or polycycle. In addition, the ring formed by combining with an adjacent group may be connected with another ring to form a spiro structure.

In the present disclosure, the term "adjacent groups" may mean a substituent substituted with an atom directly connected with another atom substituted with a corresponding substituent, a different substituent substituted with an atom substituted with a corresponding substituent, or a substituent disposed stereoscopically at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, a halogen atom may include a fluorine atom, a chlorine atom, a bromine atom, or an iodine atom.

In the present disclosure, the alkyl may have a linear or branched chain or a cycle shape. The carbon number of the alkyl may be 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl means an optional functional group or substituent derived from aromatic cyclic hydrocarbon. The aryl may be monocyclic aryl or polycyclic aryl. The carbon number of the aryl for forming a ring may be 6 to 30, 6 to 20, or 6 to 15. Examples of the aryl may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the present disclosure, fluorenyl may be substituted, or two substituents may be combined with each other to form a spiro structure.

In the present disclosure, the explanation on the aryl may be applied to the arylene, except for the case where the arylene is divalent.

In the present disclosure, the heteroaryl may be heteroaryl including at least one of O, N, P Si, or S as a heteroatom. The carbon number of the heteroaryl for forming a ring may be 2 to 30, 2 to 20, or 2 to 15. Examples of the heteroaryl may include monocyclic heteroaryl or polycyclic heteroaryl. The polycyclic heteroaryl may have a two ring structure or a three ring structure. Examples of the heteroaryl may include thienyl, furanyl, pyrrolyl, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroaryl carbazole, N-alkyl carbazole, benzoxazole, benzoimidazole, benzothiazole, benzocarbazole, benzothienyl, dibenzothiophenyl, thienothienyl, benzofuranyl, phenanthroline, thiazolyl, isooxazolyl, oxadiazolyl, thiadiazolyl, benzothiazolyl, phenothiazinyl, dibenzosilole, dibenzofuranyl, etc., without limitation.

In the present disclosure, the silyl may include alkylsilyl and arylsilyl. Examples of the silyl may include trimethylsilyl, triethylsilyl, t-butyldimethylsilyl, vinyldimethylsilyl, propyldimethylsilyl, triphenylsilyl, diphenylsilyl, phenylsilyl, etc., without limitation.

In the present disclosure, the boryl group (boron group) may include alkyl boron and aryl boron. Examples of the boron group may include trimethylboron, triethylboron, t-butyldimethylboron, triphenylboron, diphenylboron, phenylboron, etc., without limitation.

In the present disclosure, the alkenyl may be linear or branched. The carbon number is not specifically limited, but may be 2 to 30, 2 to 20, or 2 to 10. Examples of the alkenyl may include vinyl, 1-butenyl, 1-pentenyl, 1,3-butadienyl aryl, styrenyl, styrylvinyl, etc., without limitation.

In the present disclosure, the carbon number of the amino group is not specifically limited, but may be 1 to 30. The amino group may include an alkyl amino group and aryl amino group. Examples of the amino group may include methylamino, dimethylamino, phenylamino, diphenylamino, naphthylamino, 9-methyl-anthracenylamino, triphenylamino, etc., without limitation.

In the present disclosure, the carbon number of carbonyl group is not specifically limited, and may be 1 to 40, 1 to 30, or 1 to 20. For example, the carbonyl group may have the structures below, but an embodiment of the present disclosure is not limited thereto.

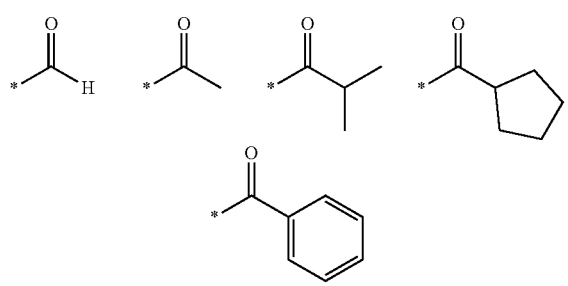

In the present disclosure, the sulfoxy group may include an alkyl sulfoxy group and an aryl sulfoxy group.

In the present disclosure, the alkoxy group may have a linear chain, a branched chain, or a cyclic chain. The carbon number of the alkoxy group is not specifically limited and may be, for example, 1 to 20, or 1 to 10. Examples of the alkoxy group include methoxy, ethoxy, n-propoxy, isopropoxy, butoxy, pentyloxy, hexyloxy, octyloxy, nonyloxy, decyloxy, benzyloxy, or the like. However, an embodiment of the present disclosure is not limited thereto.

In the present disclosure, examples of an aryl group among aryloxy, arylthio, arylsulfoxy, aralkyl, arylamino, aryl sulfoxy, aryl boronyl, aryl silyl, and aryl phosphine, are the same as described above.

In the present disclosure, examples of an alkyl group among aralkyl, alkylthio, alkylsulfoxy, alkylaryl, alkylamino, alkyl boronyl, and alkyl silyl are the same as described above.

Hereinafter, the heterocyclic compound according to an embodiment of the present disclosure will be explained.

The heterocyclic compound according to an embodiment of the present disclosure may be represented by Formula 1 below.

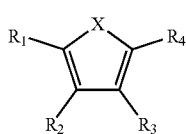

[Formula 1]

In Formula 1, X may be, e.g., $NR_5$, O or S. $R_1$ to $R_4$, may each independently be or include, e.g., a hydrogen atom, a substituted or unsubstituted amino group, a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms. In an implementation, $R_1$ to $R_4$, may be separate or form a ring via the combination of adjacent groups from each other. $R_5$ may be or may include, e.g., a hydrogen atom, a deuterium atom, a substituted or unsubstituted silyl group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms.

In an implementation, in Formula 1, at least one of $R_1$ to $R_4$ may be or may include, e.g., a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted aralkyl group, a substituted or unsubstituted sulfoxy group, a substituted or unsubstituted phosphine oxide group.

In an implementation, in Formula 1, at least two of $R_1$ to $R_4$ may not be the aryl group or the heteroaryl group. For example, a sum of a number of aryl groups and heteroaryl groups among $R_1$ to $R_4$ may be 2 or less. Here, the aryl group means a substituted or unsubstituted aryl group having 6 to 30 ring carbon atoms, and the heteroaryl group means a substituted or unsubstituted heteroaryl group having 2 to 30 ring carbon atoms.

In an implementation, in Formula 1, the sum of the number of the aryl group and the heteroaryl group among $R_1$ to $R_4$ may be, e.g., 2. In an implementation, in Formula 1, two of $R_1$ to $R_4$ may each independently be an aryl group or a heteroaryl group, and at least one of the remaining two thereof may be a substituted or unsubstituted silyl group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted aralkyl group, a substituted or unsubstituted sulfoxy group, or a substituted or unsubstituted phosphine oxide group. In an implementation, the carbon number of the aryl group forming a ring may be 6 to 15, and the carbon number of the heteroaryl group forming a ring may be 2 to 15.

In an implementation, in Formula 1, two of $R_1$ to $R_4$ may each independently be an aryl group or a heteroaryl group, and at least one of the remaining two thereof may be a substituted or unsubstituted silyl group. In an implementation, at least one of the remaining two may be an arylsilyl group. an implementation, at least one of the remaining two thereof may be a substituted or unsubstituted phenylsilyl group, a substituted or unsubstituted diphenylsilyl group, or a substituted or unsubstituted triphenylsilyl group. an implementation, at least one of the remaining two thereof may be, e.g., a substituted or unsubstituted triphenylsilyl group.

In an implementation, in Formula 1, two of $R_1$ to $R_4$ may each independently be or include, e.g., a substituted or unsubstituted phenyl group, and at least one of the remaining two thereof may be, e.g., a triphenylsilyl group. In an implementation, the compound represented by Formula 1 may be represented by one of the following Formulae 1-1 to 1-4.

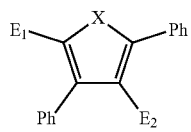

[Formula 1-1]

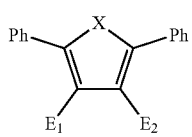

[Formula 1-2]

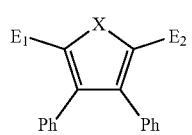

[Formula 1-3]

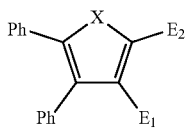

[Formula 1-4]

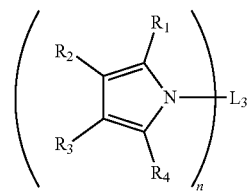

[Formula 2]

In Formulae 1-1 to 1-4, Ph may be, e.g., a substituted or unsubstituted phenyl group, $E_1$ and $E_2$ may each independently be, e.g., a hydrogen atom, or a substituted or unsubstituted triphenylsilyl group, where at least one of $E_1$ and $E_2$ is a substituted or unsubstituted triphenylsilyl group. Ph may be a phenyl group unsubstituted or substituted with an arylsilyl group. Ph may be a phenyl group unsubstituted or substituted with a triphenylsilyl group.

In an implementation, in Formula 1, two of $R_1$ to $R_4$ may each independently be, e.g., an aryl group or a heteroaryl group. In an implementation, one may be a substituted or unsubstituted phenyl group, and the other one may be a substituted or unsubstituted monocyclic heteroaryl group. In an implementation, both two among $R_1$ to $R_4$ may be substituted or unsubstituted aryl groups. In this case, two aryl groups may be the same or different. In an implementation, two among $R_1$ to $R_4$ may both be substituted or unsubstituted heteroaryl groups, and two heteroaryl groups may be the same or different.

In an implementation, in Formula 1, two of $R_1$ to $R_4$ may each independently be, e.g., an aryl group or a heteroaryl group, and at least one of the remaining two thereof may be, e.g., a substituted or unsubstituted aralkyl group. For example, at least one of the remaining two thereof may be a triphenylalkyl group.

In an implementation, in Formula 1, X may be, e.g., $NR_5$. For example, in Formula 1, X may be $NR_5$ and $R_5$ may be a substituted or unsubstituted aryl group having 6 to 15 ring carbon atoms. For example, $R_5$ may be a substituted or unsubstituted phenyl group. In an implementation, the compound represented by Formula 1 may be represented by Formula 1-5 below. In an implementation, in Formula 1, X may be O or S.

[Formula 1-5]

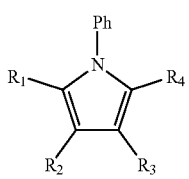

In Formula 1-5, Ph may be, e.g., a substituted or unsubstituted phenyl group, and $R_1$ to $R_4$ are the same as described above. Ph may be a phenyl group unsubstituted or substituted with an arylsilyl group, e.g., a phenyl group unsubstituted or substituted with a triphenylsilyl group.

In an implementation, in Formula 1, X may be $NR_5$, and at least one of $R_1$ to $R_5$ may be a group represented by $-L_1-Y_1$. $L_1$ may be or may include, e.g., a substituted or unsubstituted arylene group having 6 to 30 ring carbon atoms. $Y_1$ may be or may include, e.g., a substituted or unsubstituted silyl group, a substituted or unsubstituted pyrrolyl group, a substituted or unsubstituted thienyl group, or a substituted or unsubstituted furanyl group.

In an implementation, in Formula 1, X may be $NR_5$, and $R_5$ may be represented by $-L_1-Y_1$. In an implementation, the compound represented by Formula 1 may be represented by, e.g., Formula 2 below.

In Formula 2, n may be, e.g., an integer of 1 to 3, $L_3$ may be, e.g., a direct linkage or a substituted or unsubstituted aryl group having 6 to 30 ring carbon atoms, and $R_1$ to $R_4$ may be the same as described above. For example, X may be $NR_5$, and $R_5$ may be a group having a substitution scheme or pattern such that the heterocyclic compound includes at least one more pyrrolyl moiety (when n is 2 or 3).

In an implementation, the direct lineage may include a single bond.

In an implementation, in Formula 2, in a case where n is 2 or more, a plurality of $R_1$ to $R_4$ may be the same or different. For example, in Formula 2, in a case where n is 2 or more, structures in parentheses may be the same or different.

In an implementation, in Formula 2, in a case where n is 1, $L_3$ may be a monovalent group, in a case where n is 2, $L_3$ may be a divalent group, and in a case where n is 3, $L_3$ may be a trivalent group.

In an implementation, in Formula 2, n may be 2, and $L_3$ may be a substituted or unsubstituted arylene group having 6 to 15 ring carbon atoms. In an implementation, in Formula 2, n may be 2, and $L_3$ may be a substituted or unsubstituted monocyclic arylene group. In an implementation, in Formula 2, n may be 2, and $L_3$ may be a substituted or unsubstituted phenylene group, e.g., a p-phenylene group or an m-phenylene group.

In an implementation, in Formula 1, at least one of $R_1$ to $R_4$ may be a group represented by $-L_1-Y_1$. In an implementation, in Formula 1, one of $R_1$ to $R_4$ may be a group represented by $-L_1-Y_1$. In an implementation, the compound represented by Formula 1 may be represented by, e.g., Formula 3 below.

[Formula 3]

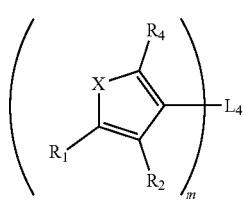

In Formula 3, m may be, e.g., an integer of 1 to 3, $L_4$ may be, e.g., a direct linkage or a substituted or unsubstituted aryl group having 6 to 30 ring carbon atoms, and X, $R_1$, $R_2$, and $R_4$ may be the same as described above. For example, $R_3$ may be a group having a substitution scheme or pattern such that the heterocyclic compound includes at least one more pyrrolyl moiety (when m is 2 or 3).

In Formula 3, in a case where m is 2 or more, a plurality of $R_1$, $R_2$, and $R_4$ may be the same or different. For example, in Formula 3, in a case where m is 2 or more, structures in parentheses may be the same or different.

In Formula 3, in a case where m is 1, $L_4$ may be a monovalent group, in a case where m is 2, $L_4$ may be a divalent group, and in a case where m is 3, $L_4$ may be a trivalent group.

In an implementation, in Formula 3, m may be 2, and $L_4$ may be or may include, e.g., a substituted or unsubstituted arylene group having 6 to 15 ring carbon atoms. In an implementation, in Formula 3, m may be 2, and $L_4$ may be or may include, e.g., a substituted or unsubstituted monocyclic arylene group. In an implementation, in Formula 3, m may be 2, and $L_4$ may be a substituted or unsubstituted phenylene group, e.g., an m-phenylene group. Formula 3 corresponds to Formula 1 where $R_3$ is a group represented by $-L_1-Y_1$.

In an implementation, in Formula 3, X may be, e.g., $NR_5$.

In an implementation, in Formula 3, at least one of $R_1$, $R_2$, and $R_4$ may be, e.g., a substituted or unsubstituted silyl group. In an implementation, in Formula 3, at least two of $R_1$, $R_2$, and $R_4$ may not be an aryl group or a heteroaryl group.

In an implementation, the compound represented by Formula 1 may be represented by, e.g., Formula 4 below.

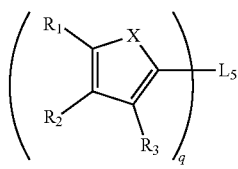

[Formula 4]

In Formula 4, q may be, e.g., an integer of 1 to 3, $L_5$ may be or may include, e.g., a direct linkage or a substituted or unsubstituted aryl group having 6 to 30 ring carbon atoms, and X and $R_1$ to $R_3$ may be the same as described above. For example, $R_4$ may be a group having a substitution scheme or pattern such that the heterocyclic compound includes at least one more pyrrolyl moiety (when m is 2 or 3).

In Formula 4, in a case where q is 2 or more, a plurality of $R_1$ to $R_3$ may be the same or different. For example, in Formula 4, in a case where q is 2 or more, structures in parentheses may be the same or different.

In Formula 4, in a case where q is 1, $L_5$ may be a monovalent group, in a case where q is 2, $L_5$ may be a divalent group, and in a case where q is 3, $L_5$ may be a trivalent group.

In an implementation, in Formula 4, q may be 2, and $L_5$ may be, e.g., a substituted or unsubstituted arylene group having 6 to 15 ring carbon atoms. In an implementation, in Formula 4, q may be 2, and $L_5$ may be, e.g., a substituted or unsubstituted monocyclic arylene group. In an implementation, in Formula 4, q may be 2, and $L_5$ may be a substituted or unsubstituted phenylene group, e.g., an m-phenylene group. Formula 4 corresponds to Formula 1 where $R_2$ is a group represented by $-L_1-Y_1$.

In an implementation, in Formula 4, X may be, e.g., $NR_5$.

In an implementation, in Formula 4, at least one of $R_1$ to $R_3$ may be, e.g., a substituted or unsubstituted silyl group. In an implementation, in Formula 4, at least two of $R_1$ to $R_3$ may not be an aryl group or a heteroaryl group.

As described above, in an implementation, in Formula 1, $R_1$ to $R_4$ may form a ring via the combination of adjacent groups with each other. In an implementation, in Formula 1, adjacent groups of $R_1$ to $R_4$ may be combined with each other to form a substituted or unsubstituted hydrocarbon ring, or a substituted or unsubstituted heterocycle. In an implementation, the compound represented by Formula 1 may be represented by Formula 5 below.

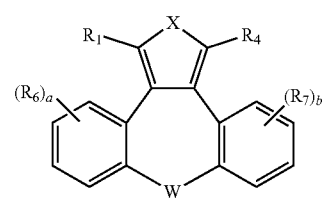

[Formula 5]

In Formula 5, W may be, e.g., O, S, $PR_8$, $S=O$, $SO_2$, $P=OR_9$, $CR_{10}R_{11}$, or $SiR_{12}R_{13}$. $R_6$ to $R_{13}$ may each independently be or include, e.g., a hydrogen atom, a deuterium atom, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms. a and b may each independently be, e.g., an integer of 0 to 4. X, $R_1$ and $R_4$ may be the same as described above.

In a case where a is 2 or more, a plurality of $R_6$ may be the same or different. In a case where b is 2 or more, a plurality of $R_7$ may be the same or different.

In an implementation, in Formula 5, W may be, e.g., 0 or $CR_{10}R_{11}$.

In an implementation, in Formula 5, at least one of $R_1$ to $R_4$ may be, e.g., a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted aralkyl group, a substituted or unsubstituted sulfoxy group, or a substituted or unsubstituted phosphine oxide group.

In an implementation, in Formula 5, at least one of $R_1$ and $R_4$ may be, e.g., a substituted or unsubstituted silyl group. In an implementation, in Formula 5, at least one of $R_1$ and $R_4$ may be, e.g., a substituted or unsubstituted triphenylsilyl group.

In an implementation, the compound represented by Formula 1 may be represented by Formula 6 below.

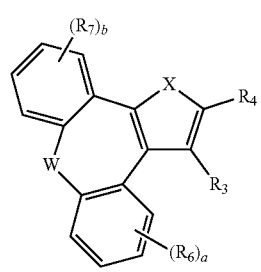

[Formula 6]

In Formula 6, W, $R_6$, $R_7$, a, and b may be the same as defined in Formula 5, and $R_3$, $R_4$, and X are the same as defined above.

In an implementation, the compound represented by Formula 1 may be represented by Formula 7 below.

[Formula 7]

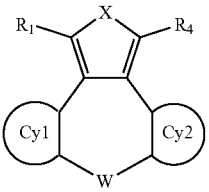

In Formula 7, Cy1 and Cy2 may each independently be or include, e.g., a substituted or unsubstituted hydrocarbon ring or a substituted or unsubstituted heterocycle. The hydrocarbon ring may include an aromatic hydrocarbon ring and an aliphatic hydrocarbon ring, and the heterocycle may include an aromatic heterocycle and an aliphatic heterocycle. In an implementation, Cy1 and Cy2 may each independently be a five-membered ring or a six-membered ring.

In Formula 7, W may be the same as defined in Formula 5, and $R_1$, $R_4$, and X may be the same as defined in Formula 1.

The heterocyclic compound represented by Formula 1 may be used as a material for an organic electroluminescence device. For example, the heterocyclic compound represented by Formula 1 may be used as a hole transport material.

In an implementation, the heterocyclic compound represented by Formula 1 may be, e.g., a compound of the following Compound Group 1.

[Compound Group 1]

1

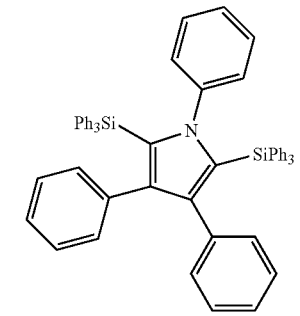

2

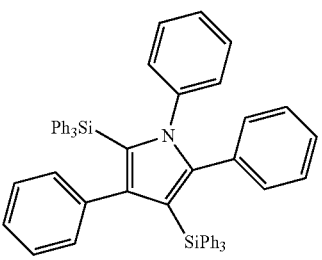

3

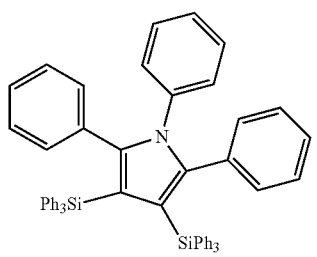

4

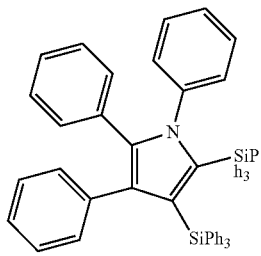

5

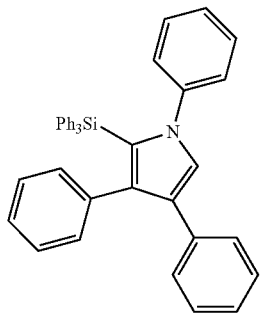

6

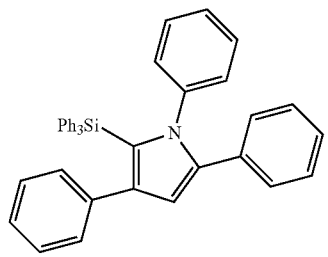

7

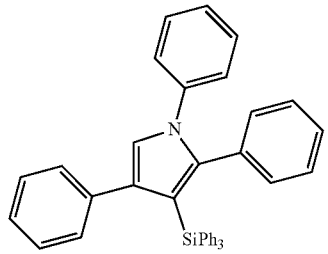

8

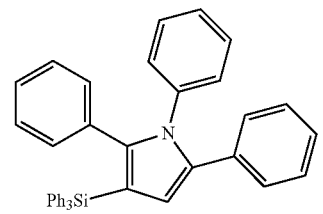

9

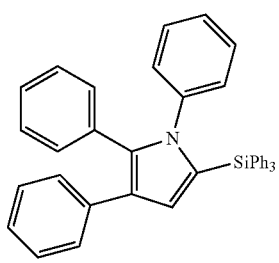

10
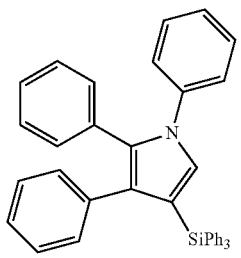
11
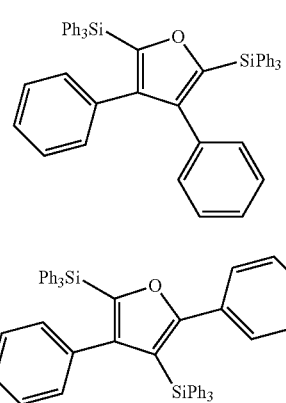
12
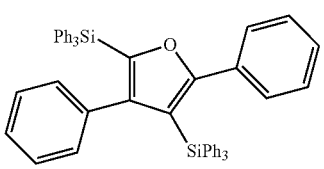
13
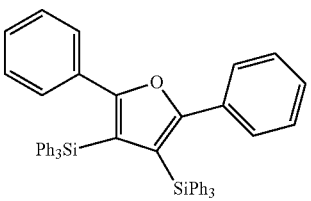
14
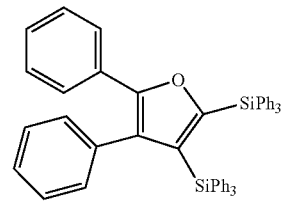
15
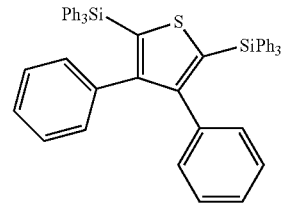
16
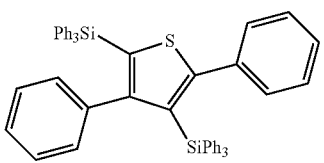
17
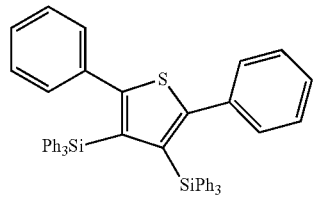
18
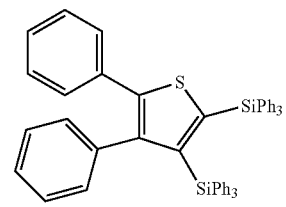
19
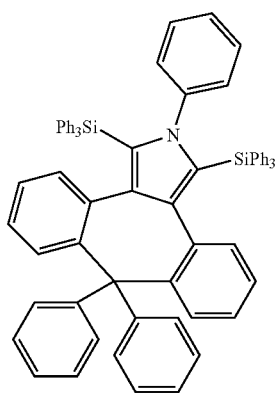
20
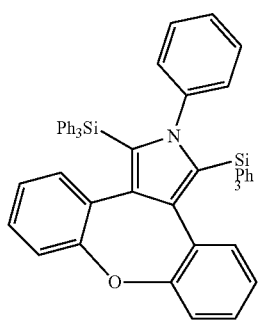
25
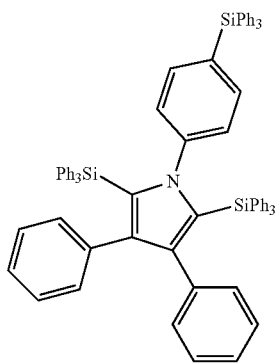

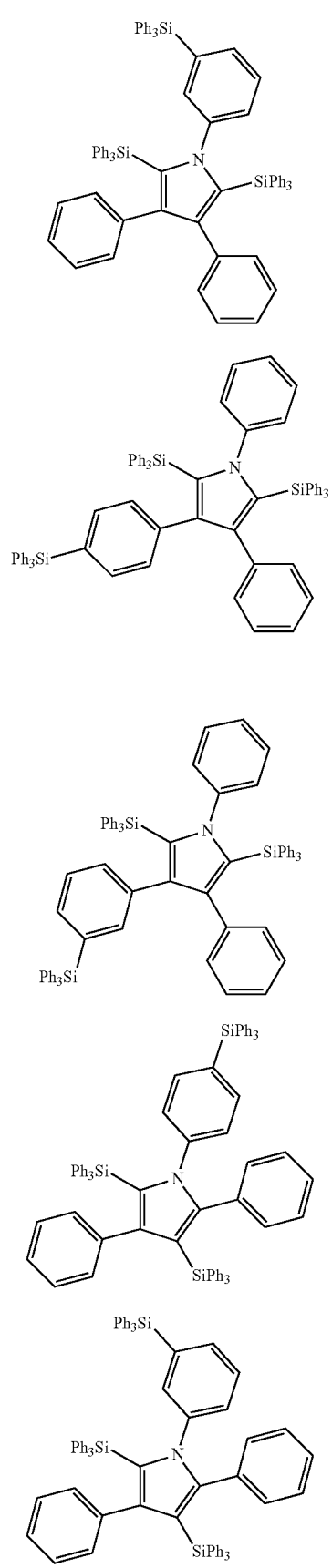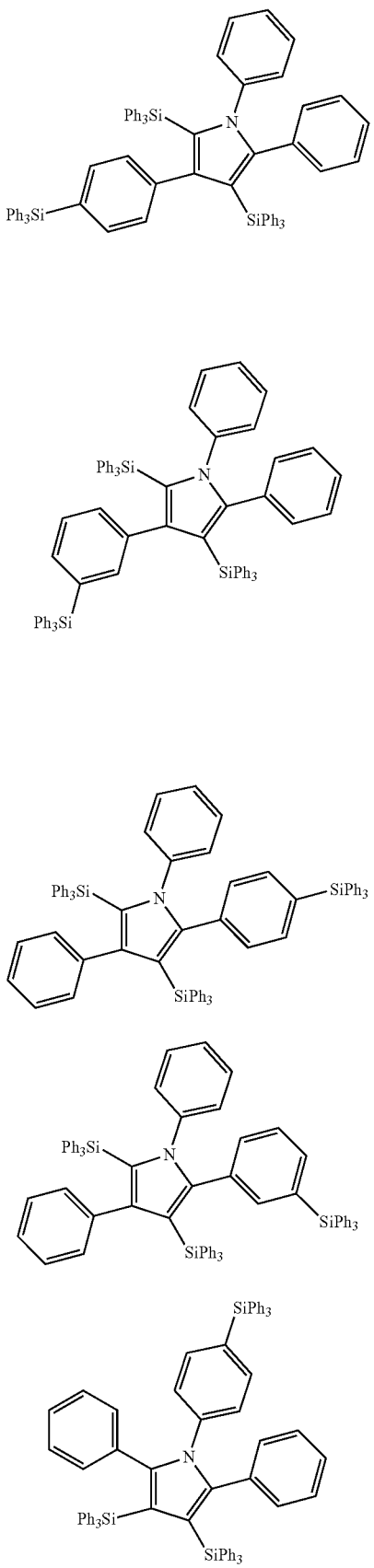

-continued
36
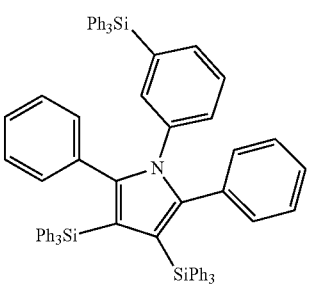
37
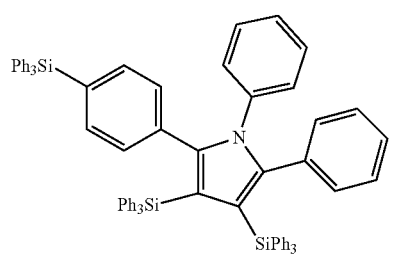
38
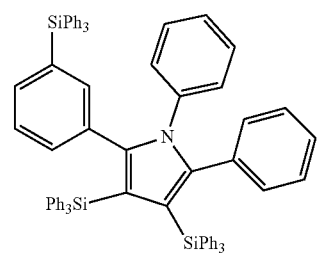
39
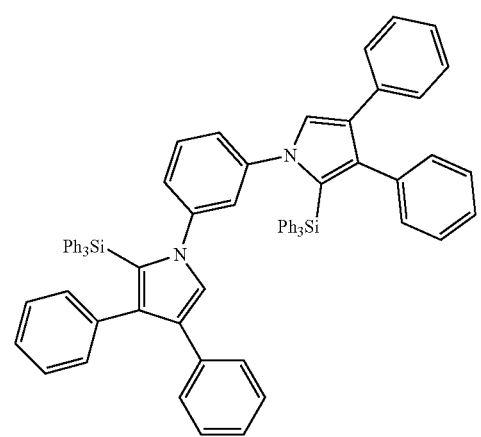
-continued
40
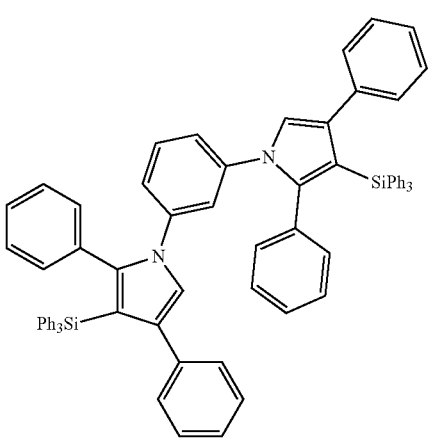
41
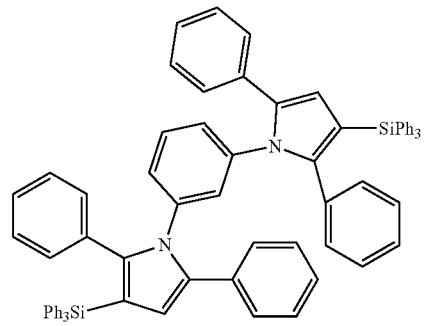
42
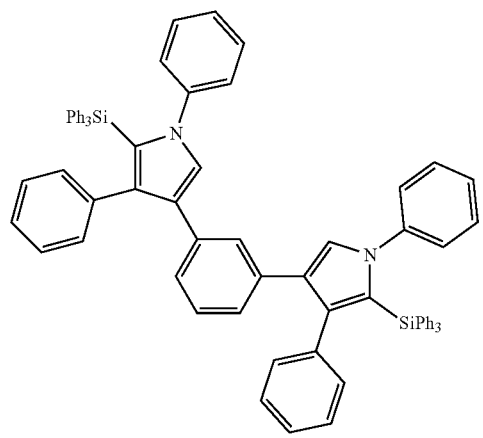
43
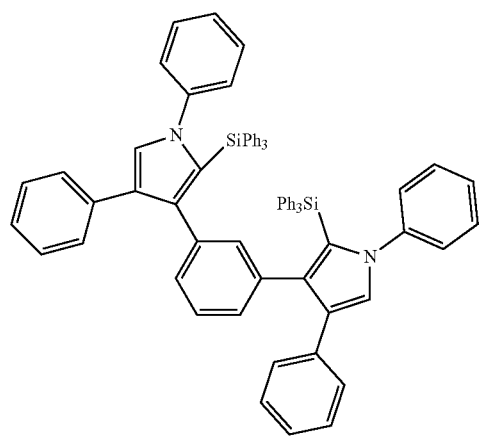

-continued
44
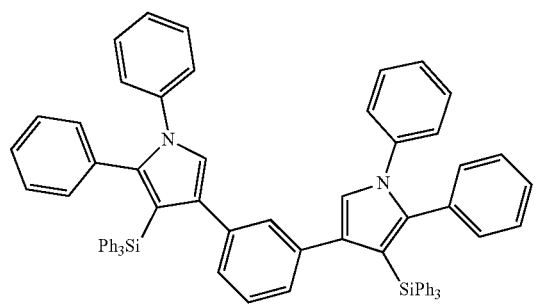
45
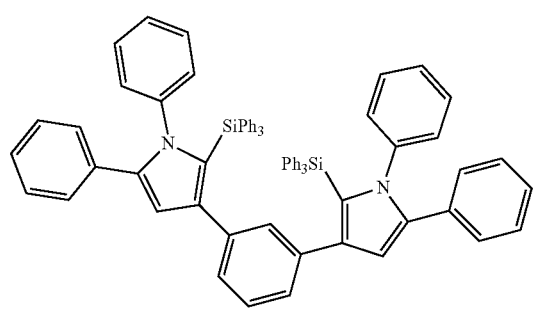
46
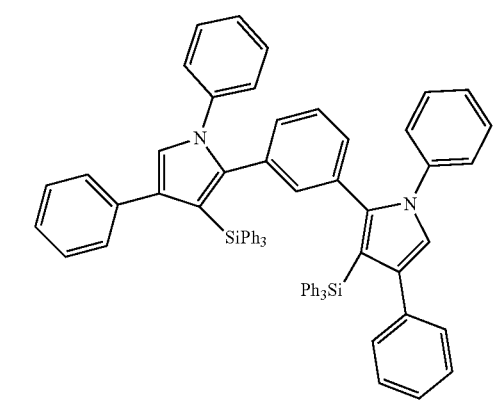
47
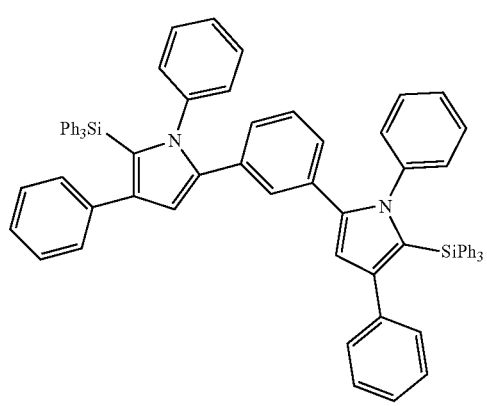
-continued
48
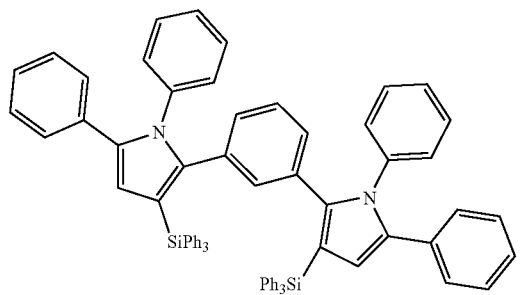
49
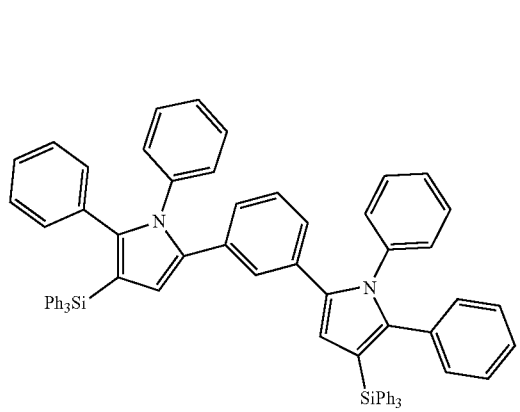
50
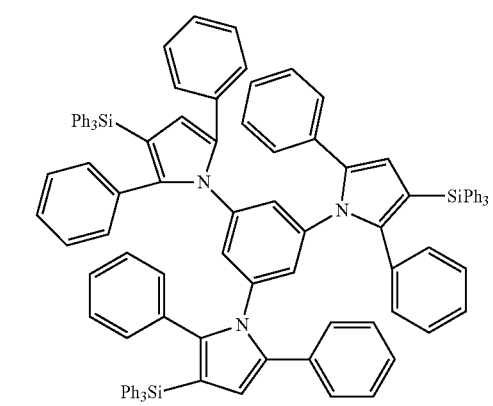
51
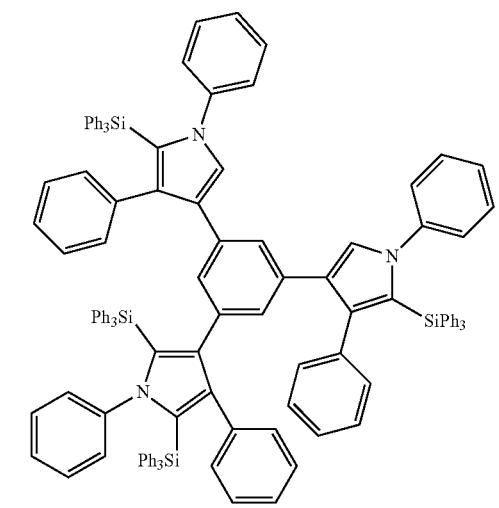

52
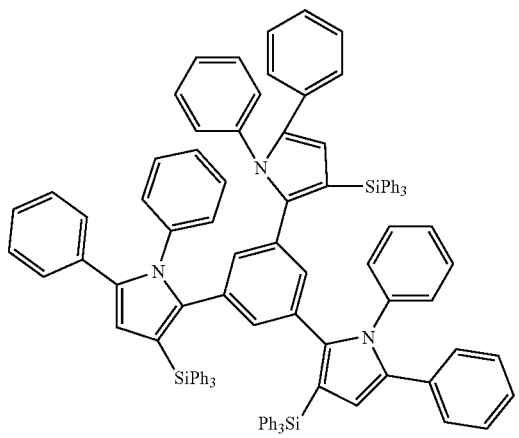
53
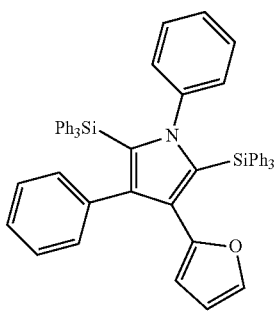
54
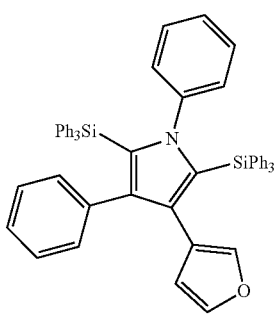
55
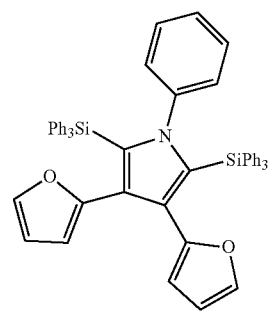
56
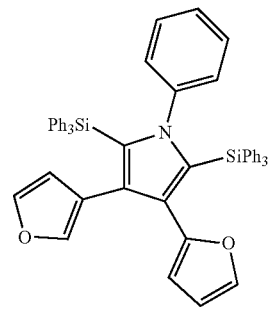
57
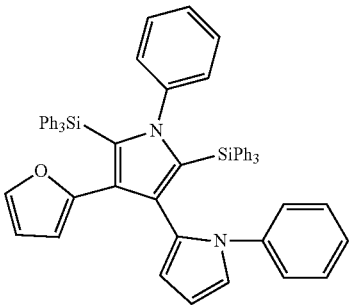
58
59
60

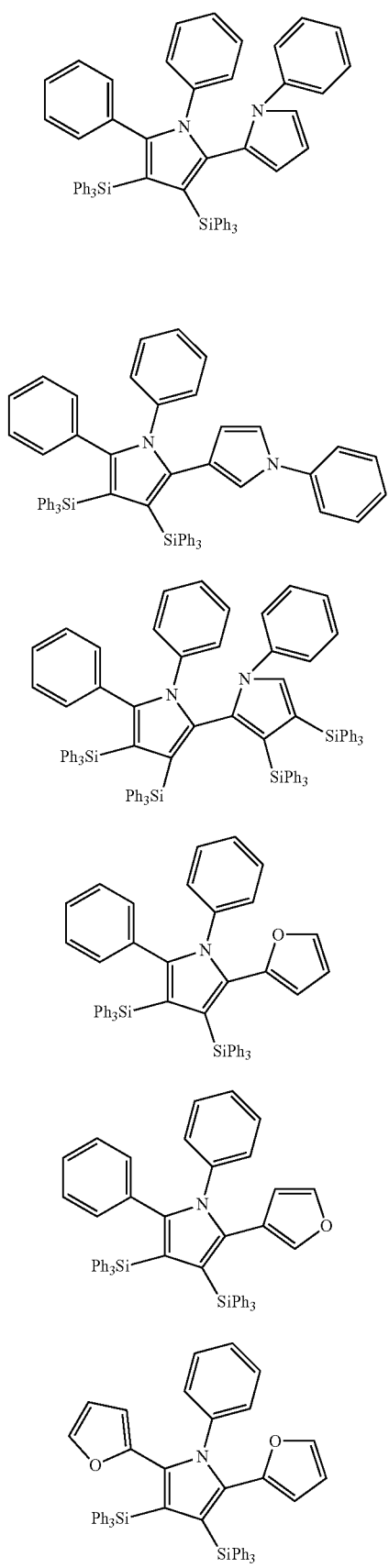
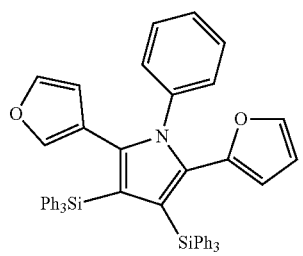
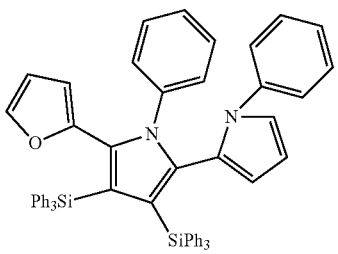
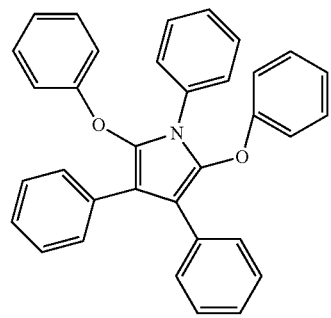
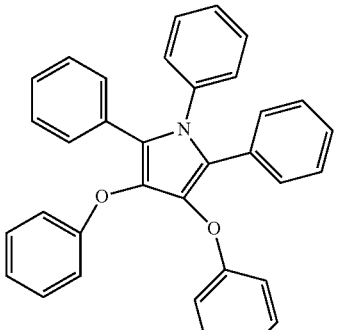
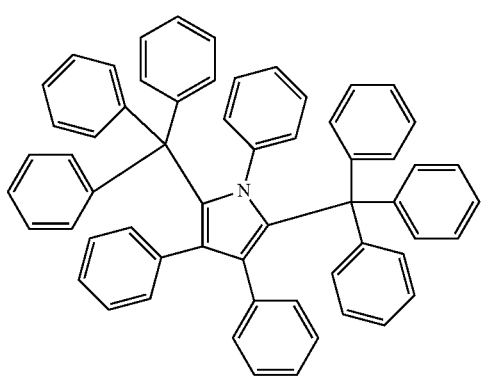

-continued

72

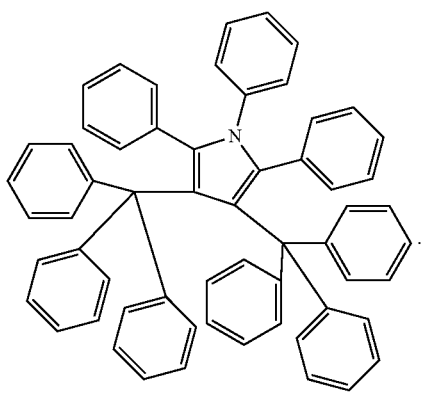

When the heterocyclic compound according to an embodiment of the present disclosure is used in an organic electroluminescence device, effects of high efficiency and/or long life may be achieved.

Hereinafter, an organic electroluminescence device according to an embodiment of the inventive step will be explained. The explanation will be mainly with the difference in the heterocyclic compound according to an embodiment of the present disclosure, and unexplained part will follow the above-description on the heterocyclic compound according to an embodiment of the present disclosure.

The organic electroluminescence device according to an embodiment of the present disclosure may include the above-described heterocyclic compound.

Figure 2:
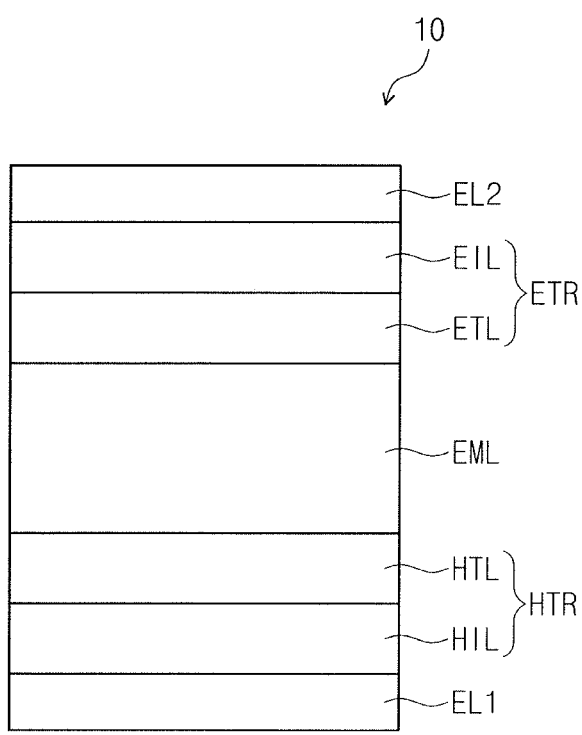
FIG. 2 illustrates a cross-sectional view of an organic electroluminescence device according to an embodiment of the present disclosure.

FIG. 1 illustrates a cross-sectional view of an organic electroluminescence device according to an embodiment of the present disclosure. FIG. 2 illustrates a cross-sectional view of an organic electroluminescence device according to an embodiment of the present disclosure.

Referring to FIGS. 1 and 2, an organic electroluminescence device 10 according to an embodiment of the present disclosure may include a first electrode EL1, a hole transport region HTR, an emission layer EML, an electron transport region ETR, and a second electrode EL2.

The first electrode EL1 has conductivity. The first electrode EL1 may be a pixel electrode or an anode. The first electrode EL1 may be a transmissive electrode, a transflective electrode, or a reflective electrode. In a case where the first electrode EL1 is the transmissive electrode, the first electrode EL1 may be formed using a transparent metal oxide such as indium tin oxide (ITO), indium zinc oxide (IZO), zinc oxide (ZnO), or indium tin zinc oxide (ITZO). In a case where the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including the reflective layer or transflective layer formed using the above materials, or a transparent layer formed using ITO, IZO, ZnO, or ITZO.

The hole transport region HTR is provided on the first electrode EL1. The hole transport region HTR may include at least one of a hole injection layer HIL, a hole transport layer HTL, a hole buffer layer, or an electron blocking layer. The thickness of the hole transport region HTR may be, e.g., from about 1,000 Å to about 1,500 Å.

Hereinafter, an embodiment of including the heterocyclic compound in a hole transport region HTR will be explained.

In an implementation, the heterocyclic compound according to an embodiment of the present disclosure may be included in at least one organic layer provided between a first electrode EL1 and a second electrode EL2. For example, the heterocyclic compound according to an embodiment of the present disclosure may be included in an emission layer EML.

The hole transport region HTR may include the heterocyclic compound according to an embodiment of the present disclosure. For example, the hole transport region HTR may include a heterocyclic compound represented by Formula 1.

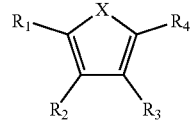

[Formula 1]

Particular description on X and $R_1$ to $R_4$ are the same as described above and will be omitted. For example, X may be $NR_5$.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL and a hole transport layer HTL, or may have a structure of a single layer formed using a hole injection material and a hole transport material. In an implementation, the hole transport region HTR may have a structure of a single layer formed using a plurality of different materials, or a structure laminated one by one from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer.

In a case where the hole transport region HTR includes a structure of hole injection layer HIL/hole transport layer HTL, the heterocyclic compound according to an embodiment of the present disclosure may be included in the hole transport layer HTL. In an implementation, when the hole transport region HTR has a multilayer structure, the heterocyclic compound according to an embodiment of the present disclosure may be included in a layer contacting an emission layer, or in each of the layer contacting an emission layer and the hole transport layer HTR. When the hole transport layer HTL includes the heterocyclic compound according to an embodiment of the present disclosure, the hole transport layer HTL may include one kind or two or more kinds of the heterocyclic compound.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, e.g., a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-dinaphtalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

When the hole transport layer HTL includes the heterocyclic compound according to an embodiment of the present disclosure, other materials may be further include in addition to the heterocyclic compound. For example, carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphthyl)-N,N'-diphenylbenzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), etc. may be further included.

The thickness of the hole transport region HTR may be from about 100 Å to about 10,000 Å, e.g., from about 100 Å to about 1,000 Å. In a case where the hole transport region HTR includes both the hole injection layer HIL and the hole transport layer HTL, the thickness of the hole injection layer HIL may be from about 100 Å to about 10,000 Å, e.g., from about 100 Å to about 1,000 Å, and the thickness of the hole transport layer HTL may be from about 30 Å to about 1,000 Å. In a case where the thicknesses of the hole transport region HTR, the hole injection layer HIL, and the hole transport layer HTL satisfy the above-described ranges, satisfactory hole transport properties may be obtained without the substantial increase of a driving voltage.

The hole transport region HTR may further include a charge generating material other than the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds. Examples of the p-dopant may include quinone derivatives such as tetracyanoquinodimethane (TCNQ), and 2,3,5,6-tetrafluoro-tetracyanoquinodimethane (F4-TCNQ), and metal oxides such as tungsten oxide, and molybdenum oxide.

As described above, the hole transport region HTR may further include one of a hole buffer layer or an electron blocking layer other than the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR to the hole transport region HTR.

The emission layer EML is provided on the hole transport region HTR. The emission layer EML is a layer emitting light by fluorescence or phosphorescence and may be formed to a thickness of about 100 Å to about 600 Å.

The emission layer EML may have a single layer formed using a single material, a single layer formed using a plurality of different materials, or a multilayer structure having a plurality of layers formed using a plurality of different materials.

As the material of the emission layer EML, known emission materials may be used and may be selected from fluoranthene derivatives, pyrene derivatives, arylaceylene derivatives, fluorene derivatives, perylene derivatives, chrysene derivatives, or the like. For example, pyrene derivatives, perylene derivatives, and anthracene derivatives may be used.

For example, the emission layer EML may include a fluorescent material including spiro-DPVBi, 2,2',7,7'-tetrakis(biphenyl-4-yl)-9,9'-spirobifluorene (spiro-6P, spiro-sexiphenyl), distyryl-benzene (DSB), distyryl-arylene (DSA), a polyfluorene (PFO)-based polymer, and a poly(p-phenylene vinylene) (PPV)-based polymer.

The emission layer may further include a dopant and the dopant may use known materials. For example, styryl derivatives (for example, 1,4-bis[2-(3-N-ethylcarbazoryl) vinyl]benzene (BCzVB), 4-(di-p-tolylamino)-4"-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBPe)), pyrene and the derivatives thereof (for example, 1,1-dipyrene, 1,4-dipyrenylbenzene, 1,4-bis(N,N-diphenylamino)pyrene), 2,5,8,11-tetra-t-butylperylene (TBP), 1,3,5-tris(N-phenylbenzimidazole-2-yl)benzene (TPBi), or bis[2(4,5-difluorophenyl)pyridinato-$C^2$,N](picolinato) (Firpic), or the like may be used as the dopant.

The emission layer EML may include, e.g., tris(8-hydroxyquinolino)aluminum (Alq3), 4,4'-bis(N-carbazolyl)-1,1'-biphenyl (CBP), poly(n-vinylcarbazole) (PVK), 9,10-di (naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis (triphenylsilyl)benzene (UGH2), hexaphenylcyclotrisiloxane (DPSiO3), octaphenylcyclotetra siloxane ($DPSiO_4$), 1,3-bis(N-carbazolyl)benzene (mCP), 2,8-bis(diphenylphosphoryl)dibenzofuran (PPF), etc.

The electron transport region ETR is provided on the emission layer EML. The electron transport region ETR may include, e.g., at least one of an electron blocking layer, an electron transport layer ETL, or an electron injection layer EIL.

The electron transport region ETR may have a single layer formed using a single material, a single layer formed using a plurality of different materials, or a multilayer structure including a plurality of layers formed using a plurality of different materials.

For example, the electron transport region ETR may have the structure of a single layer such as the electron injection layer EIL or the electron transport layer ETL, or a single layer structure formed using an electron injection material and an electron transport material. In an implementation, the electron transport region ETR may have a single layer structure formed using a plurality of different materials, or a structure laminated one by one from the first electrode EL1 of electron transport layer ETL/electron injection layer EIL, or hole blocking layer/electron transport layer ETL/electron injection layer EIL. The thickness of the electron transport region ETR may be, e.g., from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In a case where the electron transport region ETR includes the electron transport layer ETL, the electron transport region ETR may include tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl)anthracene (ADN), or a mixture thereof. The thickness of the electron transport layer ETL may be from about 100 Å to about 1,000 Å, e.g., from about 150 Å to about 500 Å. If the thickness of the electron transport layer ETL satisfies the above-described range, satisfactory electron transport properties may be obtained without the substantial increase of a driving voltage.

In a case where the electron transport region ETR includes the electron injection layer EIL, the electron transport region ETR may include LiF, lithium quinolate (LiQ), Li$_2$O, BaO, NaCl, CsF, a metal in lanthanides such as Yb, or a metal halide such as RbCl and RbI. The electron injection layer EIL also may be formed using a mixture material of an electron transport material and an insulating organo metal salt. The organo metal salt may be a material having an energy band gap of about 4 eV or more. Particularly, the organo metal salt may include, for example, a metal acetate, a metal benzoate, a metal acetoacetate, a metal acetylacetonate, or a metal stearate. The thickness of the electron injection layer EIL may be from about 1 Å to about 100 Å, e.g., about 3 Å to about 90 Å. In a case where the thickness of the electron injection layer EIL satisfies the above described range, satisfactory electron injection properties may be obtained without inducing the substantial increase of a driving voltage.

The electron transport region ETR may include a hole blocking layer, as described above. The hole blocking layer may include, e.g., at least one of 2,9-dimethyl-4,7-diphenyl-1,10-phenanthroline (BCP), or 4,7-diphenyl-1,10-phenanthroline (Bphen).

The second electrode EL2 is provided on the electron transport region ETR. The second electrode EL2 may be a common electrode or a cathode. The second electrode EL2 may be a transmissive electrode, a transflective electrode or a reflective electrode. In a case where the second electrode EL2 is the transmissive electrode, the second electrode EL2 may include a transparent metal oxide, e.g., ITO, IZO, ZnO, ITZO, etc.

In a case where the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). The second electrode EL2 may have a multilayered structure including a reflective layer or a transflective layer formed using the above-described materials or a transparent conductive layer formed using ITO, IZO, ZnO, ITZO, etc.

In an implementation, the second electrode EL2 may be connected with an auxiliary electrode. If the second electrode EL2 is connected with the auxiliary electrode, the resistance of the second electrode EL2 may be decreased.

In the organic electroluminescence device 10, voltages are applied to each of the first electrode EL1 and the second electrode EL2, and holes injected from the first electrode EL1 move via the hole transport region HTR to the emission layer EML, and electrons injected from the second electrode EL2 move via the electron transport region ETR to the emission layer EML. The electrons and holes are recombined in the emission layer EML to generate excitons, and the excitons may emit light via transition from an excited state to a ground state.

The organic electroluminescence device according to an embodiment of the present disclosure includes the heterocyclic compound represented by Formula 1 and may accomplish high efficiency and/or long life.

Hereinafter, the present disclosure will be explained more particularly referring to preferred embodiments and comparative embodiments. The following embodiments are only for illustration to assist the understanding of the present disclosure, but the scope of the present disclosure is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthetic Examples

The heterocyclic compound according to an embodiment of the present disclosure may be synthesized, e.g., as follows.

1. Synthesis of Compound 1

Compound 1 was synthesized by the following reaction:

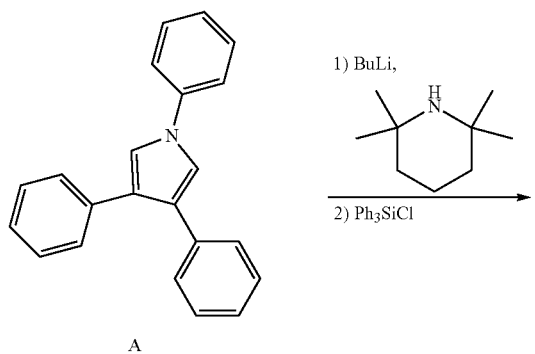

A

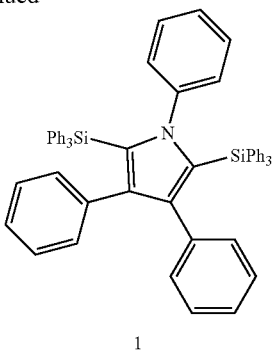

1

Under an argon (Ar) atmosphere, 80 ml of a dehydrated THF solution of 6.3 ml of 2,2,6,6-tetramethylpiperidine was added to a 500 ml three neck flask, and 23 ml (36.8 mmol) of a hexane solution of 1.6 M n-BuLi was added thereto dropwise at about 0° C., followed by stirring for about 2 hours. The temperature was decreased to about −78° C. and 92 ml of a THF solution of 5.43 g (18.4 mmol) of Compound A was added thereto, followed by stirring at about −78° C. for about 2 hours. Then, 80 ml of a dehydrated THF solution of 10.85 g (36.8 mmol) of chlorotriphenylsilane was added thereto dropwise and stirred for about 2 hours, followed by stirring at ambient temperature for about 3 hours. After finishing the reaction, 1N HCl aqueous solution was added and stirred for about 1 hour. The solution thus obtained was washed with water, and an organic phase was concentrated to obtain a viscous material. The crude product thus obtained was separated by silica gel column chromatography to produce 6.72 g (yield 45%) of Compound 1 as a white solid.

The molecular weight of Compound 1 measured by FAB-MS was 812. The chemical shift values (δ) of Compound 1 measured by $^1$H NMR (CDCl$_3$) were as follows. $^1$H-NMR (300 MHz, CDCl$_3$): 7.63-7.57 (3H), 7.52-7.45 (22H), 7.42-7.37 (20H).

2. Synthesis of Compound 3

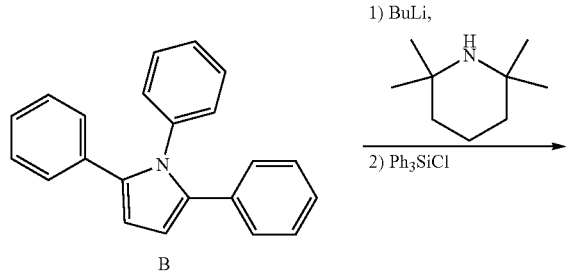

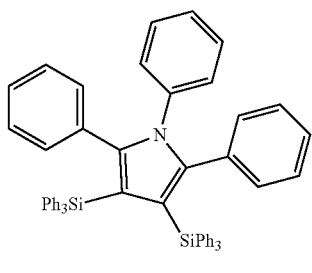

3

Under an argon (Ar) atmosphere, 80 ml of a dehydrated THF solution of 6.3 ml of 2,2,6,6-tetramethylpiperidine was added to a 500 ml three neck flask, and 23 ml (36.8 mmol) of a hexane solution of 1.6 M n-BuLi was added thereto dropwise at about 0° C., followed by stirring for about 2 hours. The temperature was decreased to about −78° C. and 92 ml of a dehydrated THF solution of 5.43 g (18.4 mmol) of Compound B was added thereto, followed by stirring at about −78° C. for about 2 hours. Then, 80 ml of a dehydrated THF solution of 10.85 g (36.8 mmol) of chlorotriphenylsilane was added thereto dropwise and stirred for about 2 hours, followed by stirring at ambient temperature for about 3 hours. After finishing the reaction, 1N HCl aqueous solution was added and stirred for about 1 hour. The solution thus obtained was washed with water, and an organic phase was concentrated to obtain a viscous material. The crude product thus obtained was separated by silica gel column chromatography to produce 5.08 g (yield 34%) of Compound 3 as a white solid.

The molecular weight of Compound 1 measured by FAB-MS was 812. The chemical shift values (δ) of Compound 3 measured by $^1$H NMR (CDCl$_3$) were as follows. $^1$H-NMR (CDCl$_3$): 7.84 (4H), 7.63-7.57 (3H), 7.54-7.45 (20H), 7.39-7.37 (18H).

3. Synthesis of Compound 11

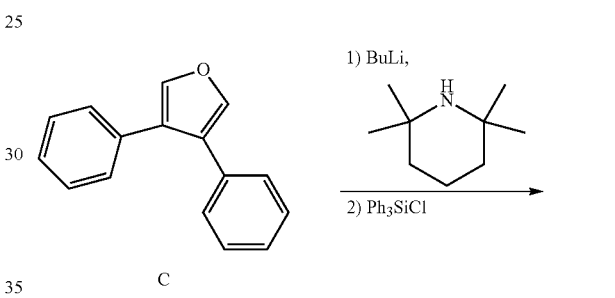

C

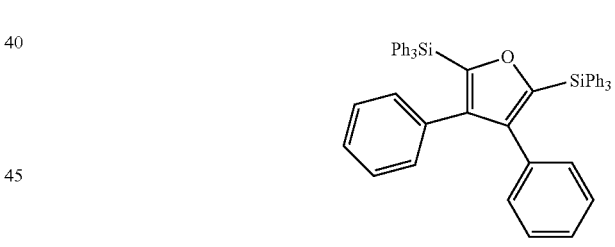

11

Under an argon (Ar) atmosphere, 100 ml of a dehydrated THF solution of 7.7 ml of 2,2,6,6-tetramethylpiperidine was added to a 500 ml three neck flask, and 28 ml (45.0 mmol) of a hexane solution of 1.6 M n-BuLi was added thereto dropwise at about 0° C., followed by stirring for about 2 hours. The temperature was decreased to about −78° C. and 113 ml of a dehydrated THF solution of 4.96 g (22.5 mmol) of Compound C was added thereto, followed by stirring at about −78° C. for about 2 hours. Then, 100 ml of a dehydrated THF solution of 13.27 g (45.0 mmol) of chlorotriphenylsilane was added thereto dropwise and stirred for about 2 hours, followed by stirring at ambient temperature for about 3 hours. After finishing the reaction, 1N HCl aqueous solution was added and stirred for about 1 hour. The solution thus obtained was washed with water, and an organic phase was concentrated to obtain a viscous material. The crude product thus obtained was separated by silica gel column chromatography to produce 8.62 g (yield 52%) of Compound 11 as a white solid.

The molecular weight of Compound 11 measured by FAB-MS was 737. The chemical shift values (δ) of Compound 11 measured by ¹H NMR (CDCl₃) were as follows.
¹H-NMR (CDCl₃): 7.52-7.45 (20H), 7.42-7.37 (20H).

4. Synthesis of Compound 13

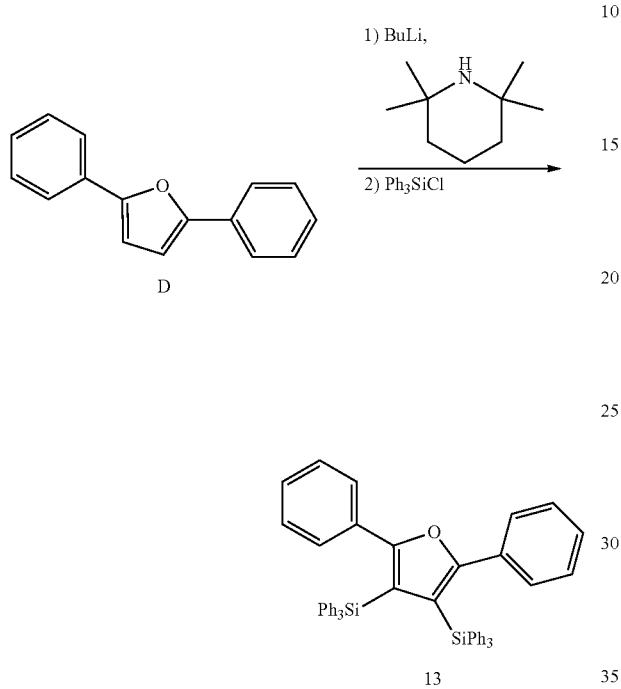

Under an argon (Ar) atmosphere, 100 ml of a dehydrated THF solution of 7.7 ml of 2,2,6,6-tetramethylpiperidine was added to a 500 ml three neck flask, and 28 ml (45.0 mmol) of a hexane solution of 1.6 M n-BuLi was added thereto dropwise at about 0° C., followed by stirring for about 2 hours. The temperature was decreased to about −78° C. and 113 ml of a dehydrated THF solution of 4.96 g (22.5 mmol) of Compound C was added thereto, followed by stirring at about −78° C. for about 2 hours. Then, 100 ml of a dehydrated THF solution of 13.27 g (45.0 mmol) of chlorotriphenylsilane was added thereto dropwise and stirred for about 2 hours, followed by stirring at ambient temperature for about 3 hours. After finishing the reaction, 1N HCl aqueous solution was added and stirred for about 1 hour. The solution thus obtained was washed with water, and an organic phase was concentrated to obtain a viscous material. The crude product thus obtained was separated by silica gel column chromatography to produce 6.47 g (yield 39%) of Compound 13 as a white solid.

The molecular weight of Compound 13 measured by FAB-MS was 737. The chemical shift values (δ) of Compound 13 measured by ¹H NMR (CDCl₃) were as follows.
¹H-NMR (CDCl₃): 8.07 (4H), 7.61-7.59 (6H), 7.46 (12H), 7.39-7.37 (18H).

(Device Manufacturing Examples)

Organic electroluminescence devices of Examples 1 to 4 were manufactured using Compounds 1, 3, 11, and 13 as hole transport materials.

[Example Compounds]

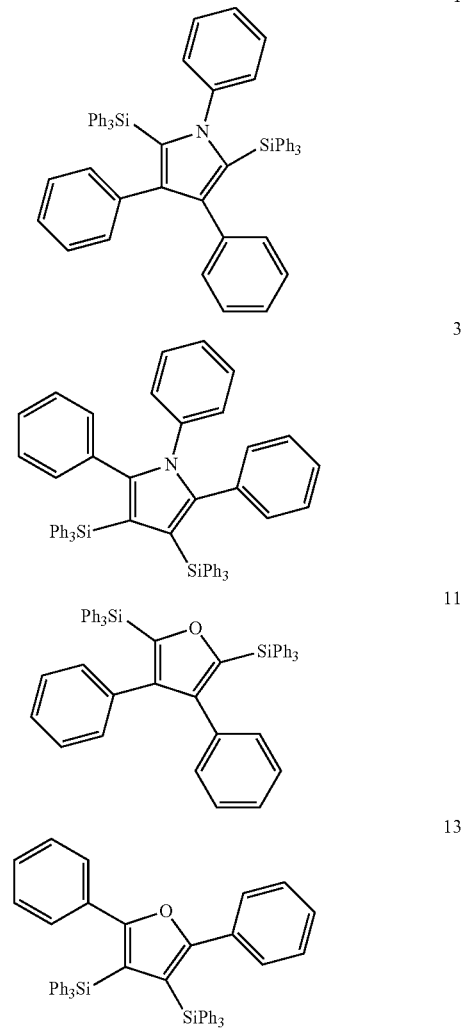

Organic electroluminescence devices of Comparative Examples 1 to 5 were manufactured using Comparative Compounds c1 to c5 as hole transport materials.

[Comparative Compounds]

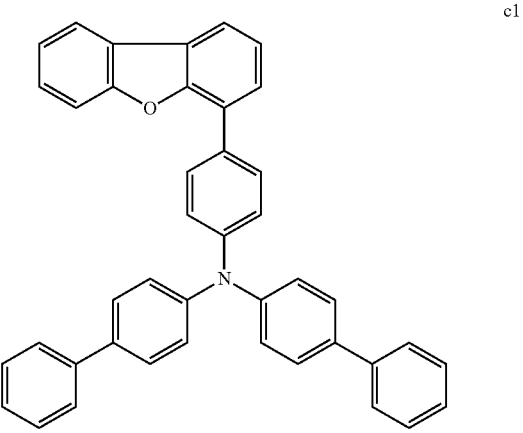

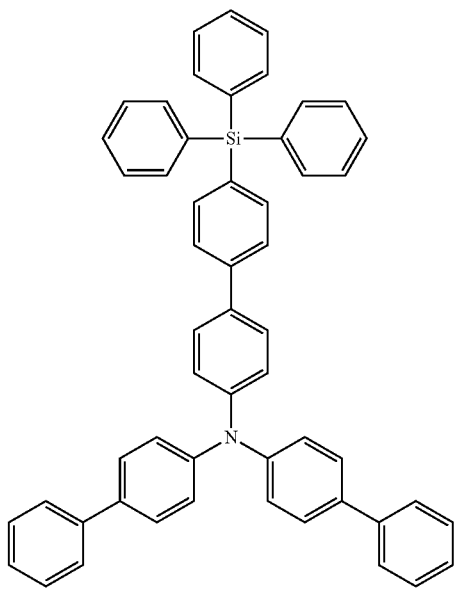

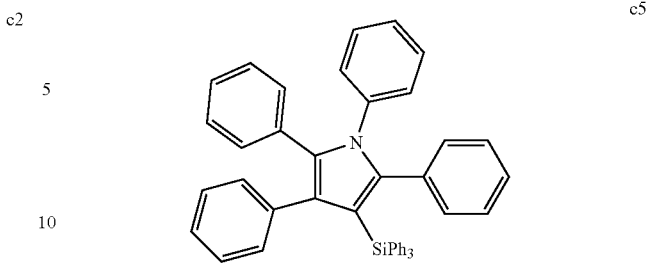

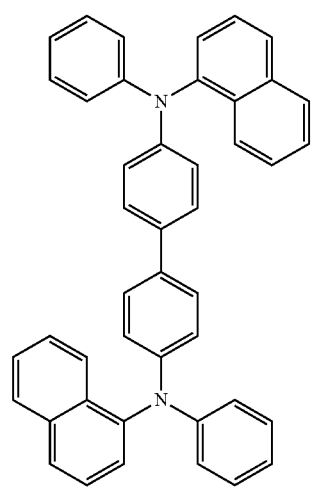

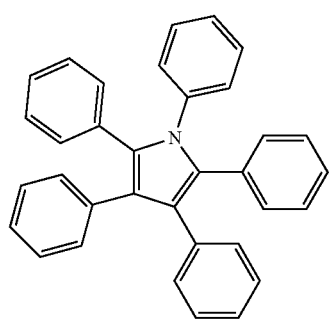

TABLE 1

| Device manufacturing example | Hole transport material | Maximum emission life |
|---|---|---|
| Example 1 | Example Compound 1 | 115% |
| Example 2 | Example Compound 3 | 125% |
| Example 3 | Example Compound 11 | 115% |
| Example 4 | Example Compound 13 | 105% |
| Comparative Example 1 | Comparative Compound c1 | 100% |
| Comparative Example 2 | Comparative Compound c2 | 95% |
| Comparative Example 3 | Comparative Compound c3 | 90% |
| Comparative Example 4 | Comparative Compound c4 | 100% |
| Comparative Example 5 | Comparative Compound c5 | 100% |

The emission efficiency of the devices were respectively measured using Source Meter of 2400 Series manufactured by Keithley Instruments Co. Ltd., a CS-200 Chroma Meter manufactured by Konica Minolta Holdings Co., Ltd., and PC program LabVIEW 8.2 for measurement manufactured by Japanese National Instruments Co., Ltd. in a dark room.

From the results of Table 1, the heterocyclic compound of Examples 1-4 exhibited an effect of improving the emission efficiency of an organic electroluminescence device.

For example, the heterocyclic compound of Examples 1-4 included a monocyclic group such as pyrrole, furan, or thiophene as a main skeleton, and had good hole transport properties and a high triplet (T1) energy level (or high energy gap). By using the heterocyclic compound in a hole transport layer which is adjacent to an emission layer, the emission efficiency of an organic electroluminescence device may be improved. Examples 1 to 4 had a higher triplet (T1) energy level than Comparative Examples 1 to 5, and emission efficiency was improved.

The heterocyclic compound according to an embodiment of the present disclosure has excellent emission efficiency.

The organic electroluminescence device including the heterocyclic compound according to an embodiment of the present disclosure may accomplish high emission efficiency The embodiments may provide a heterocyclic compound which may be used as a hole transport material and an organic electroluminescence device including the same in a hole transport region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heterocyclic compound represented by the following Formulae 3, 4, or 5:

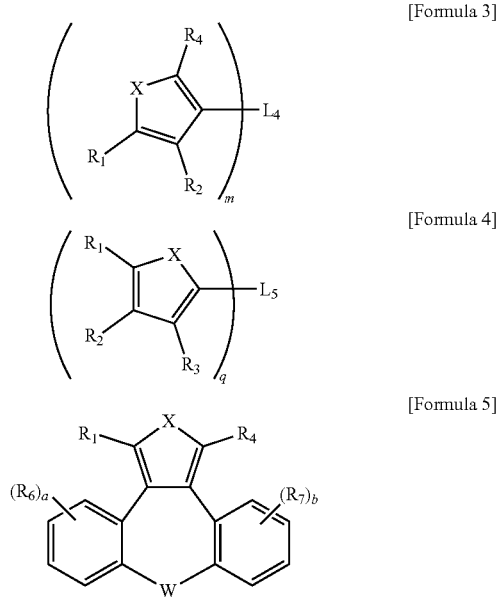

wherein in Formulae 3 to 5,

X is $NR_5$, O, or S, wherein, in Formulae 3 and 4, $R_1$ to $R_4$ are each independently a hydrogen atom, a substituted or unsubstituted amino group, a substituted or unsubstituted arylsilyl group, a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, $R_1$ to $R_4$ being separate from each other, $R_5$ is a hydrogen atom, a deuterium atom, a substituted or unsubstituted silyl group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, at least one of $R_1$ to $R_4$ is a substituted or unsubstituted triarylsilyl group, at least one of $R_1$ to $R_4$, $L_4$, and $L_5$ is a substituted or unsubstituted phenyl group, a substituted or unsubstituted furanyl group, or a substituted or unsubstituted pyrrolyl group, at least two of $R_1$ to $R_4$ are not an aryl group or a heteroaryl group, in Formula 3, m is an integer of 1 to 3, when m is 2 or 3, a plurality of $R_1$, $R_2$, and $R_4$ are the same or different from each other, and $L_4$ is a direct linkage or a substituted or unsubstituted aryl group having 6 to 30 ring carbon atoms, in Formula 4, q is an integer of 1 to 3, when q is 2 or 3, a plurality of $R_1$ to $R_3$ are the same or different from each other, and $L_5$ is a direct linkage or a substituted or unsubstituted aryl group having 6 to 30 ring carbon atoms, in Formula 5, W is O, S, $PR_8$, S=O, $SO_2$, P=$OR_9$, $CR_{10}R_{11}$, or $SiR_{12}R_{13}$, $R_1$ and $R_4$ are each independently a hydrogen atom, a substituted or unsubstituted amino group, a substituted or unsubstituted arylsilyl group, a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, $R_1$ to $R_4$ being separate or forming a ring via combination of adjacent groups with each other, $R_5$ is a hydrogen atom, a deuterium atom, a substituted or unsubstituted silyl group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, at least one of $R_1$ and $R_4$ is a substituted or unsubstituted arylsilyl group, $R_6$ to $R_{13}$ are each independently a hydrogen atom, a deuterium atom, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, at least two of $R_1$, $R_4$, $R_6$ and $R_7$ are not an aryl group or a heteroaryl group, a and b are each independently an integer of 0 to 4.

2. The heterocyclic compound as claimed in claim 1, wherein, in Formulae 3 and 4:

one of $R_1$ to $R_4$ is an aryl group or a heteroaryl group.

3. The heterocyclic compound as claimed in claim 1, wherein, in Formulae 3 and 4:

one of $R_1$ to $R_4$ is a substituted or unsubstituted aryl group having 6 to 15 ring carbon atoms or a substituted or unsubstituted heteroaryl group having 2 to 15 ring carbon atoms.

4. The heterocyclic compound as claimed in claim 3, wherein, in Formulae 3 and 4:

one of $R_1$ to $R_4$ is a substituted or unsubstituted phenyl group.

5. The heterocyclic compound as claimed in claim 1, wherein X is $NR_5$.

6. The heterocyclic compound as claimed in claim 5, wherein $R_5$ is a substituted or unsubstituted aryl group having 6 to 15 ring carbon atoms.

7. The heterocyclic compound as claimed in claim 5, wherein $R_5$ is a substituted or unsubstituted phenyl group.

8. The heterocyclic compound as claimed in claim 1, wherein:
X is $NR_5$,
at least one of $R_1$ to $R_5$ is a group represented by $-L_1-Y_1$,
$L_1$ is a substituted or unsubstituted arylene group having 6 to 30 ring carbon atoms, and
$Y_1$ is a substituted or unsubstituted silyl group, a substituted or unsubstituted pyrrolyl group, a substituted or unsubstituted thienyl group, or a substituted or unsubstituted furanyl group.

9. An organic electroluminescence device, comprising:
a first electrode;
a hole transport region on the first electrode;
an emission layer on the hole transport region;
an electron transport region on the emission layer; and
a second electrode on the electron transport region,
wherein the hole transport region includes a heterocyclic compound represented by the following Formulae 3, 4, or 5:

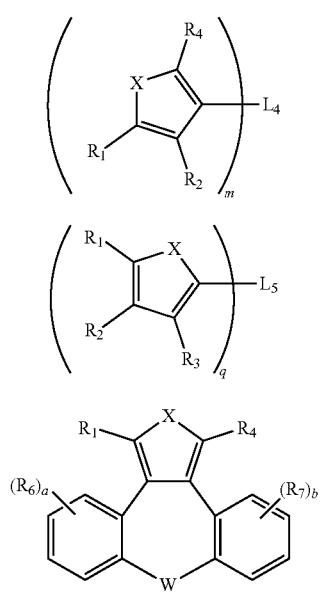

[Formula 3]

[Formula 4]

[Formula 5]

wherein in Formulae 3 to 5,
X is $NR_5$, O, or S,
$R_1$ to $R_4$ are each independently a hydrogen atom, a substituted or unsubstituted amino group, a substituted or unsubstituted arylsilyl group, a substituted or unsubstituted silyl group, a substituted or unsubstituted alkoxy group, a substituted or unsubstituted aryloxy group, a substituted or unsubstituted alkythio group, a substituted or unsubstituted arylthio group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms, $R_1$ to $R_4$ being separate or forming a ring via combination of adjacent groups with each other,
$R_5$ is a hydrogen atom, a deuterium atom, a substituted or unsubstituted silyl group, a substituted or unsubstituted boryl group, a substituted or unsubstituted sulfoxy group, a substituted or unsubstituted phosphine oxide group, a substituted or unsubstituted carbonyl group, a substituted or unsubstituted alkyl group having 1 to 10 carbon atoms, a substituted or unsubstituted aralkyl group, a substituted or unsubstituted aryl group having 6 to 30 ring carbon atoms, or a substituted or unsubstituted heteroaryl group having 2 to 30 ring carbon atoms,
at least one of $R_1$ to $R_4$ is a substituted or unsubstituted arylsilyl group, a substituted or unsubstituted aryloxy group, a substituted or unsubstituted aralkyl group,
at least two of $R_1$ to $R_4$ are not an aryl group or a heteroaryl group,
in Formula 3, m is an integer of 1 to 3,
when m is 2 or 3, a plurality of $R_1$, $R_2$, and $R_4$ are the same or different from each other, and
$L_4$ is a direct linkage or a substituted or unsubstituted aryl group having 6 to 30 ring carbon atoms,
in Formula 4, q is an integer of 1 to 3,
when q is 2 or 3, a plurality of $R_1$ to $R_3$ are the same or different from each other, and
$L_5$ is a direct linkage or a substituted or unsubstituted aryl group having 6 to 30 ring carbon atoms,
in Formula 5, W is O, S, $PR_8$, S=O, $SO_2$, P=$OR_9$, $CR_{10}R_{11}$, or $SiR_{12}R_{13}$,
$R_6$ to $R_{13}$ are each independently a hydrogen atom, a deuterium atom, a substituted or unsubstituted alkyl group having 1 to 10 carbon atoms, a substituted or unsubstituted aryl group having 6 to 30 ring carbon atoms, or a substituted or unsubstituted heteroaryl group having 2 to 30 ring carbon atoms, and
a and b are each independently an integer of 0 to 4.

10. The organic electroluminescence device as claimed in claim 9, wherein, in Formulae 3 and 4:
one of $R_1$ to $R_4$ is an aryl group or a heteroaryl group.

11. The organic electroluminescence device as claimed in claim 9, wherein
X is $NR_5$,
at least one of $R_1$ to $R_5$ is a group represented by $-L_1-Y_1$,
$L_1$ is a substituted or unsubstituted arylene group having 6 to 30 ring carbon atoms, and
$Y_1$ is a substituted or unsubstituted silyl group, a substituted or unsubstituted pyrrolyl group, a substituted or unsubstituted thienyl group, or a substituted or unsubstituted furanyl group.

12. The organic electroluminescence device as claimed in claim 9, wherein X is $NR_5$, and $R_5$ is the same as defined in claim 9.

* * * * *